United States Patent
Ranjan et al.

(10) Patent No.: US 10,497,592 B2
(45) Date of Patent: Dec. 3, 2019

(54) METHODS AND APPARATUSES FOR ESTIMATING ON-WAFER OXIDE LAYER REDUCTION EFFECTIVENESS VIA COLOR SENSING

(71) Applicant: Lam Research Corporation, Fremont, CA (US)

(72) Inventors: Manish Ranjan, Sherwood, OR (US); Cian Sweeney, Portland, OR (US); Shantinath Ghongadi, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 167 days.

(21) Appl. No.: 15/640,047

(22) Filed: Jun. 30, 2017

(65) Prior Publication Data
US 2017/0309505 A1 Oct. 26, 2017

Related U.S. Application Data

(62) Division of application No. 15/011,363, filed on Jan. 29, 2016, now Pat. No. 9,735,035.

(51) Int. Cl.
*H01J 37/32* (2006.01)
*H01L 21/67* (2006.01)
(Continued)

(52) U.S. Cl.
CPC .......... *H01L 21/67253* (2013.01); *C25D 5/34* (2013.01); *H01J 37/32935* (2013.01);
(Continued)

(58) Field of Classification Search
CPC ......... H01L 21/67023; H01L 21/67253; H01L 21/76814; H01L 21/76873;
(Continued)

(56) References Cited

U.S. PATENT DOCUMENTS

| 5,096,550 A | 3/1992 | Mayer et al. |
| 6,156,167 A | 12/2000 | Patton et al. |

(Continued)

FOREIGN PATENT DOCUMENTS

| CN | 101321295 A | 12/2008 |
| CN | 102428546 A | 4/2012 |

(Continued)

OTHER PUBLICATIONS

U.S. Office Action dated Jul. 19, 2016 issued in U.S. Appl. No. 13/928,141.

(Continued)

*Primary Examiner* — Yuechuan Yu
(74) *Attorney, Agent, or Firm* — Weaver Austin Villeneuve & Sampson LLP

(57) ABSTRACT

Disclosed are methods of preparing a semiconductor substrate having a metal seed layer for a subsequent electroplating operation. In some embodiments, the methods may include contacting the surface of the semiconductor substrate with a plasma to treat the surface by reducing metal oxides thereon and thereafter measuring a post-plasma-contact color signal from said surface, the color signal having one or more color components. The methods may then further include estimating the extent of the oxide reduction due to the plasma treatment based on the post-plasma contact color signal. In some embodiments, estimating the extent of the oxide reduction due to the plasma treatment is done based on the b* component of the post-plasma contact color signal. Also disclosed are plasma treatment apparatuses which may implement the foregoing methods.

18 Claims, 14 Drawing Sheets

(51) Int. Cl.
   *H01L 21/768* (2006.01)
   *H01L 21/66* (2006.01)
   *C25D 5/34* (2006.01)

(52) U.S. Cl.
   CPC .. *H01L 21/67023* (2013.01); *H01L 21/67201* (2013.01); *H01L 21/76814* (2013.01); *H01L 21/76862* (2013.01); *H01L 21/76873* (2013.01); *H01L 21/76879* (2013.01); *H01L 22/12* (2013.01); *H01L 22/26* (2013.01)

(58) Field of Classification Search
   CPC ......... H01L 21/76879; H01L 21/76862; H01L 21/67201; H01L 22/12; H01L 22/26; H01J 37/32935; C25D 5/34
   See application file for complete search history.

(56) References Cited

U.S. PATENT DOCUMENTS

| | | |
|---|---|---|
| 6,930,782 B1 | 8/2005 | Yi et al. |
| 7,142,300 B2 | 11/2006 | Rosengaus |
| 7,239,737 B2 | 7/2007 | Luque et al. |
| 7,423,269 B1 | 9/2008 | Azordegan et al. |
| 7,449,098 B1 | 11/2008 | Mayer et al. |
| 7,623,228 B1 | 11/2009 | Muckenhirn |
| 7,728,965 B2 | 6/2010 | Haller et al. |
| 7,760,929 B2 | 7/2010 | Orbon et al. |
| 7,780,867 B1 | 8/2010 | Mayer et al. |
| 7,787,114 B2 | 8/2010 | Wolters et al. |
| 7,811,424 B1 | 10/2010 | Woods et al. |
| 9,735,035 B1 | 8/2017 | Ranjan et al. |
| 9,809,898 B2 | 11/2017 | Dinneen et al. |
| 9,822,460 B2 | 11/2017 | Dinneen et al. |
| 10,196,753 B2 | 2/2019 | Dinneen et al. |
| 10,407,794 B2 | 9/2019 | Dinneen et al. |
| 2003/0022493 A1 | 1/2003 | Jiang et al. |
| 2004/0218804 A1 | 11/2004 | Affleck et al. |
| 2005/0013476 A1 | 1/2005 | Simpkins |
| 2005/0122509 A1 | 6/2005 | Backhauss |
| 2005/0217707 A1 | 10/2005 | Aegerter et al. |
| 2005/0280807 A1 | 12/2005 | Backhauss et al. |
| 2006/0000716 A1 | 1/2006 | Wilson et al. |
| 2007/0087530 A1 | 4/2007 | Yim et al. |
| 2007/0139645 A1 | 6/2007 | Shen et al. |
| 2008/0007726 A1 | 1/2008 | Fairley et al. |
| 2008/0013822 A1 | 1/2008 | Pai et al. |
| 2008/0047827 A1 | 2/2008 | Cheng |
| 2008/0293333 A1 | 11/2008 | Zhang et al. |
| 2009/0059236 A1 | 3/2009 | Meeks et al. |
| 2009/0116727 A1 | 5/2009 | Jin et al. |
| 2009/0122304 A1 | 5/2009 | Jin et al. |
| 2009/0205676 A1 | 8/2009 | Nakagawa |
| 2009/0268953 A1 | 10/2009 | Crucs |
| 2010/0055924 A1 | 3/2010 | Ganesan et al. |
| 2011/0054659 A1 | 3/2011 | Carlson et al. |
| 2011/0103679 A1 | 5/2011 | Campbell |
| 2011/0139757 A1 | 6/2011 | Millman, Jr. et al. |
| 2011/0218762 A1 | 9/2011 | Chen et al. |
| 2013/0005056 A1 | 1/2013 | Kim et al. |
| 2014/0079311 A1 | 3/2014 | Amzaleg et al. |
| 2014/0233844 A1 | 8/2014 | Amzaleg et al. |
| 2014/0367267 A1 | 12/2014 | Egan et al. |
| 2015/0001087 A1 | 1/2015 | Dinneen et al. |
| 2015/0206770 A1 | 7/2015 | Dinneen et al. |
| 2017/0221740 A1 | 8/2017 | Ranjan et al. |
| 2018/0038009 A1 | 2/2018 | Dinneen et al. |
| 2019/0127873 A1 | 5/2019 | Dinneen et al. |

FOREIGN PATENT DOCUMENTS

| | | |
|---|---|---|
| CN | 104037080 A | 9/2014 |
| CN | 104253086 A | 12/2014 |
| TW | 2006/16073 A | 5/2006 |
| TW | 2008/45259 A | 11/2008 |
| TW | 2011/10224 A | 3/2011 |
| WO | WO 2010/133989 | 11/2010 |

OTHER PUBLICATIONS

U.S. Notice of Allowance dated Nov. 4, 2016 issued in U.S. Appl. No. 13/928,141.
U.S. Notice of Allowance dated May 12, 2017, issued in U.S. Appl. No. 13/928,141.
U.S. Office Action dated Nov. 10, 2016 issued in U.S. Appl. No. 14/160,471.
U.S. Office Action dated Mar. 21, 2017, issued in U.S. Appl. No. 14/160,471.
Chinese First Office Action dated Aug. 17, 2016, issued in Application No. CN 201410299510.3.
Chinese Second Office Action dated Apr. 14, 2017, issued in Application No. 201410299510.3.
U.S. Office Action dated Oct. 19, 2016 issued in U.S. Appl. No. 15/011,363.
U.S. Notice of Allowance dated Mar. 30, 2017 issued in U.S. Appl. No. 15/011,363.
U.S. Notice of Allowance dated Sep. 14, 2017 issued in U.S. Appl. No. 13/928,141.
U.S. Notice of Allowance dated Jul. 27, 2017 issued in U.S. Appl. No. 14/160,471.
U.S. Notice of Allowance dated Sep. 25, 2018 issued in U.S. Appl. No. 15/782,690.
U.S. Notice of Allowance dated May 1, 2019 issued in U.S. Appl. No. 16/228,527.
U.S. Notice of Allowance [Corrected Notice of Allowability] dated Jul. 13, 2017 issued in U.S. Appl. No. 15/011,363.
Taiwan Notice of Allowance dated Nov. 21, 2017, issued in Application No. TW 103122137.
Chinese First Office Action dated Aug. 1, 2019, issued in Application No. CN 201710058368.7.

L*/a*/b* Color Space

Each color is defined by the color location (L*; a*; b*)
L* = Luminosity value (black = 0; white = 100)
a* = Green / red value (green = -100; red = +100)
b* = Blue / yellow value (blue = -100; yellow = +100)

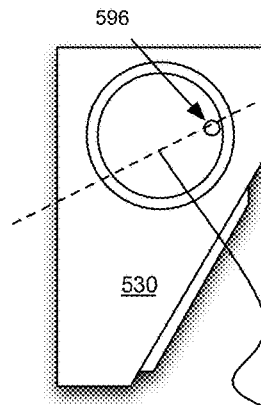
*FIG. 5B*
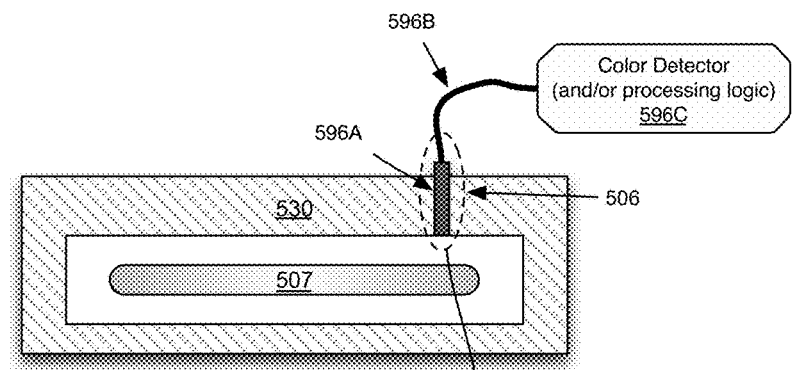
*FIG. 5C*
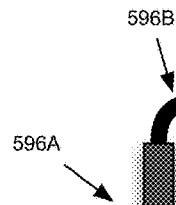
*FIG. 5D*
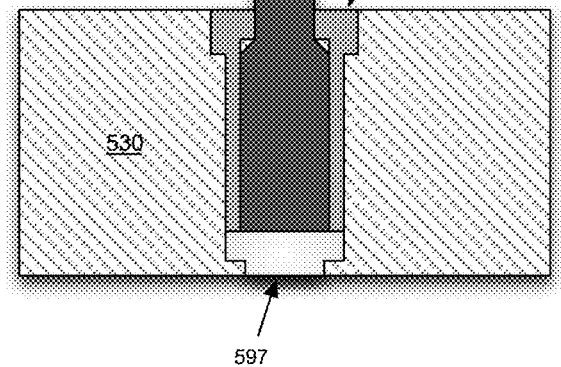

L* Plot a* Plot b* Plot

METHODS AND APPARATUSES FOR ESTIMATING ON-WAFER OXIDE LAYER REDUCTION EFFECTIVENESS VIA COLOR SENSING

CROSS-REFERENCE TO RELATED APPLICATIONS

This application is a divisional application of U.S. patent application Ser. No. 15/011,363, titled "METHODS AND APPARATUSES FOR ESTIMATING ON-WAFER OXIDE LAYER REDUCTION EFFECTIVENESS VIA COLOR SENSING" and filed on Jan. 29, 2016, and is hereby incorporated by reference in its entirety.

FIELD OF THE INVENTION

This disclosure relates to the fabrication of electronic devices, the electroplating of semiconductor substrates, electroplating systems and apparatuses having integrated and/or in situ metrology systems for examining semiconductor wafers during processing, and methods of performing metrology and examination of semiconductor wafers during processing.

BACKGROUND

The fabrication of integrated circuits often involves one or more steps of electroplating a layer of conductive metal onto the surface of a semiconductor wafer. For example, in some IC fabrication procedures, an electroplating operation may be used to fill with metal the various features formed in the surface of a semiconductor wafer such as, for instance, the trenches and vias used as conductive paths between various circuit elements. The electroplated metal is oftentimes copper, but depending on the IC design, other metals may be appropriate and/or advantageous including ruthenium, palladium, iridium, rhodium, osmium, cobalt, nickel, gold, silver, and aluminum. In some embodiments, alloys of these metals may be appropriate and/or advantageous.

In a typical electroplating operation, the surface of the wafer is exposed to an electroplating bath fluid which contains dissolved ions of the metal to be electroplated, and an electrical circuit is created between an electrode in the bath (which serves as an anode) and surface of the wafer (which serves as the cathode). Flow of current through this circuit upon application of an applied voltage causes electrons to flow to the cathode surface and reduce dissolved metal ions in its vicinity thereby resulting in the plating out of solution of neutral elemental metal onto the surface of the wafer.

However, for this circuit to be completed and for electrochemical reduction of dissolved metal ions to occur, the surface of the wafer (serving as the circuit's cathode) must be, at least to a certain extent, relatively conductive. Accordingly, since the bare surface of a semiconductor wafer is not generally substantially conductive, the actual electroplating step in an electroplating operation is often preceded by the deposition of a conductive seed layer which provides the necessary conductive surface. Deposition of the seed layer may be accomplished by any feasible method of depositing the seed material. Suitable methods may include, for example, physical vapor deposition (PVD), chemical vapor deposition (CVD), plasma-enhanced chemical vapor deposition (PECVD), conformal film deposition (CFD), atomic layer deposition (ALD), and the like. Oftentimes, seed layer deposition and electroplating is followed by an edge bevel removal (EBR) operation that removes seed metal deposited at the edge of the wafer where its presence is not desired via the application of a thin viscous flow of etchant solution over the wafer's edge.

However, oftentimes, after the seed layer is deposited, a wafer is removed from vacuum and exposed to clean room ambient air. In some instances, there could be a queue time ranging from a few minutes to several hours before the wafer is electroplated. Delay time and associated exposure to ambient air can cause oxidation of the seed layer—often referred to as "seed aging." This oxide layer resulting from seed aging, being substantially non-conductive, may act to reduce electroplating efficiency or even prevent it from occurring. In addition, the surface wetting characteristics of the wafer may change also contributing to defects on the wafer. Post-electroplating voids and pits have been seen on pattern wafers as a result of too much pre-electroplating seed aging resulting in useless IC devices and thus negatively impacting overall wafer yields. Moreover, it is observed that seed aging effects are exacerbated in lower technology nodes—sub 22 nm, for example—where seed layers are generally very thin, for example, in some circumstances 50 Å or less. Seed dissolution and reduction in current density is also seen with thinner seed in localized spots deeper into the vias and trenches with higher denser pattern densities, also causing post-electroplating wafer defects. Accordingly, methods and apparatuses have been developed to deal with oxide layer reduction and/or removal, and further improvements on these methods and apparatuses are disclosed herein.

SUMMARY OF THE DISCLOSURE

Disclosed herein are methods of preparing a semiconductor substrate having a metal seed layer for a subsequent electroplating operation. In some embodiments, the methods may include contacting the surface of the semiconductor substrate with a plasma to treat the surface by reducing metal oxides thereon and thereafter measuring a post-plasma-contact color signal from said surface, the color signal having one or more color components. The methods may then further include estimating the extent of the oxide reduction due to the plasma treatment based on the post-plasma contact color signal. In some embodiments, estimating the extent of the oxide reduction due to the plasma treatment is done based on the b* component of the post-plasma contact color signal.

Also disclosed herein are plasma treatment apparatuses for reducing metal oxides present on the surface of a metal seed layer of a semiconductor substrate in preparation for a subsequent electroplating operation. In some embodiments, the apparatuses may include a processing chamber having at least one processing station therein, a substrate holder configured to hold a substrate at the processing station, a plasma generator configured to generate a plasma within and/or provide it to the processing chamber, and a color sensor configured to measure a color signal from a substrate, the color signal having one or more color components. The apparatuses may further include a controller having non-transitory computer-readable instructions for operating the apparatus and its various components. In some embodiments, the controller may include instructions for operating the plasma generator to generate a plasma within and/or provide it to the processing chamber so that the plasma contacts the surface of a substrate at the processing station to treat it by reducing metal oxides thereon. In some embodiments, instructions may be included for operating the color sensor, after the plasma contacts the substrate surface, to measure a post-plasma-contact color signal from the surface, the color signal having one or more color components. In some embodiments, instructions may be included for estimating the extent of the oxide reduction due to the plasma treatment based on the post-plasma contact color signal. In some embodiments, said color sensor of the apparatuses may be located and/or configured so as to measure the color signal from the substrate while the substrate is located at the processing station. In some embodiments, the apparatuses may further include a load-lock configured to provide substrate access to the processing chamber, and the color sensor may be located and/or configured so as to measure the color signal from the substrate while the substrate is located within the load-lock.

BRIEF DESCRIPTION OF THE DRAWINGS

FIG. 5B presents a schematic of a load-lock of a plasma processing apparatus having a color sensor mounted in it.

FIG. 5C presents a vertical cross-section schematic (as indicated by the dashed line 505 in FIG. 5B) showing the positioning of the color sensor within the load-lock.

FIG. 5D presents a vertical cross-section schematic (zoomed in as indicated by the dashed ellipse 506 in FIG. 5C) showing the fiber optic head of the color sensor in detail.

DETAILED DESCRIPTION

Figure 1A:
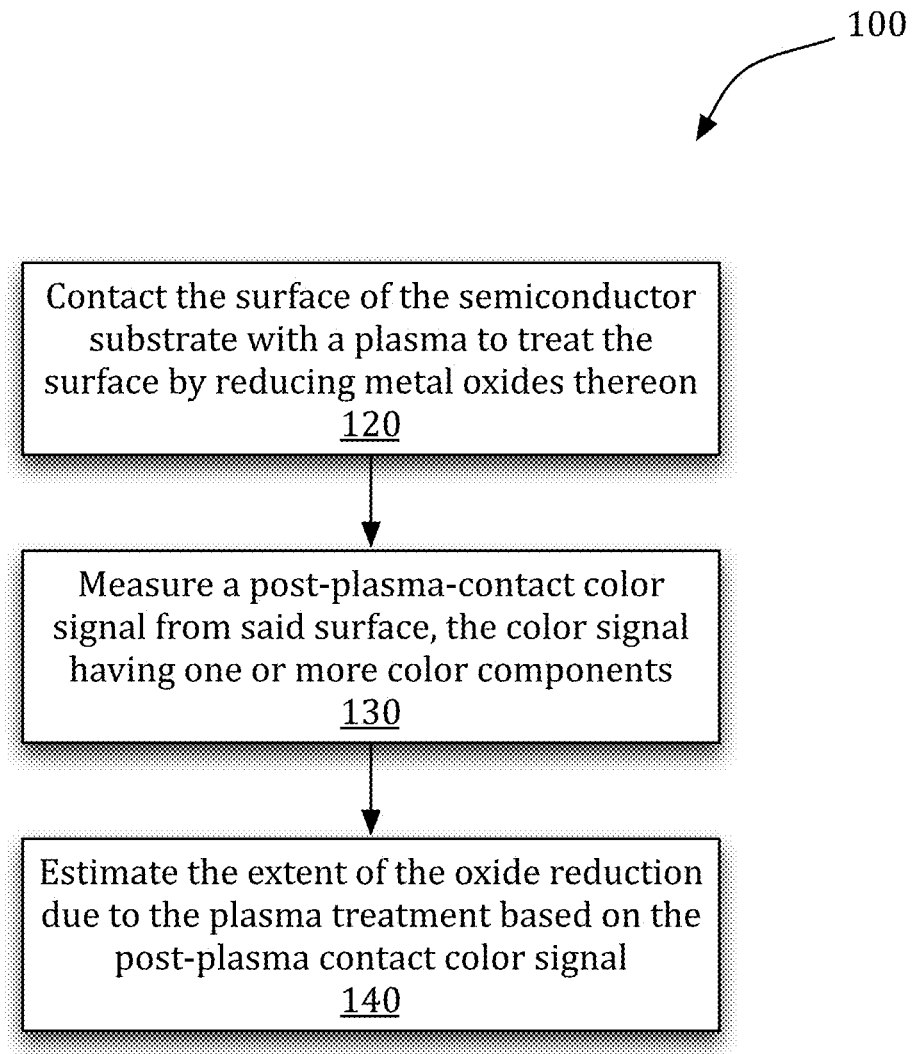
FIG. 1A is a flowchart of a method of preparing a semiconductor substrate having a metal seed layer for a subsequent electroplating operation involving the measurement of at least one color signal.

In the following disclosure, numerous specific embodiments are set forth in order to provide a thorough understanding of the inventive concepts disclosed herein. However, it will be appreciated by those skilled in the art that the inventive concepts disclosed herein may in many cases be practiced with or without certain of these specific details, such as by the substitution of alternative elements or steps, or the omission of certain elements or steps, while remaining within the scope and spirit of the inventive concepts disclosed herein. Furthermore, where certain processes, procedures, operations, steps, elements, modules, components, and/or systems are already well-known to those skilled in the art, they may not be described herein in as great of detail as necessarily possible, in order that the important aspects of the disclosed inventive concepts are not unnecessarily obscured.

Oxidation of the Seed Layer

Metal seed layers can readily react with oxygen or water vapor in the air and oxidize from a pure metal into a mixed film of a metal oxide and a buried pure metal. While the oxidation under ambient conditions may be limited to a thin surface layer of some metals, that thin layer may represent a significant fraction or perhaps the entire thickness of thin seed layers used in current technology nodes. Relatively thin seed layers may be necessitated by the technology node, such as the 4× nm node, the 3× nm node, the 2× nm node, and the 1× nm node, and less than 10 nm. The height to width aspect ratio of vias and trenches in technology nodes necessitating relatively thin metal layers can be about 5:1 or greater. In such technology nodes, the average thickness of the metal seed layer can be less than about 100 Å as a result. In some implementations, the average thickness of the metal seed layer can be less than about 50 Å.

Through the general chemical reactions shown in Equation 1 and Equation 2 below, metals used for seed or barrier layers are converted to metal oxides (Mox), though the exact reaction mechanisms between the metal surfaces (M) and ambient oxygen or water vapor can vary depending on the properties and the oxidation state.

$$2M_{(s)} + O_{2(g)} \rightarrow 2MOx_{(s)} \qquad \text{Equation 1:}$$

$$2M_{(s)} + H_2O_{(g)} \rightarrow M_2Ox + H_{2(g)} \qquad \text{Equation 2:}$$

For example, copper seed deposited on substrates is known to rapidly form copper oxide upon exposure to the air. A copper oxide film can form a layer that is approximately 20 Å and upwards to 50 Å thick on top of underlying copper metal. As metal seed layers become thinner and thinner, the formation of metal oxides from oxidation in ambient conditions can pose significant technical challenges.

As mentioned, conversion of pure metal seed to metal oxide can be problematic. This is true not only in current copper damascene processing, but also for electrodeposition processes that use other conductive metals, such as ruthenium, cobalt, silver, aluminum, and alloys of these metals. First, an oxidized surface is difficult to plate on. For one thing, the oxidized surface is not as conductive as the bare seed metal tending to inhibit the rate of electroplating. The surface may not be uniformly oxidized, however, making plating—since the rate of plating depends on the surface conductivity—non-uniform as well as slow. Moreover, electroplating bath additives may interactive differently with metal oxide versus pure metal, causing further non-uniformity in the electroplating rate.

Second, as result of oxidation, voids may be formed in the metal seed layer that may make portions of the seed layer unavailable to support plating. The voids may form as a result of dissolution of metal oxide during exposure to corrosive plating solutions. The voids also may form on the surface due to non-uniform plating. Additionally, plating bulk metal on top of an oxidized surface can lead to adhesion or delamination problems, which can further lead to voids following subsequent processing steps, such as chemical mechanical planarization (CMP). Voids that result from etching, non-uniform plating, delamination, or other processes may make the metal seed layer discontinuous, and unavailable to support plating. In fact, because modern damascene metal seed layers are relatively thin, such as (as stated) about 50 Å or thinner, even a little oxidation may consume the entire thickness of the seed layer.

Third, and more generally, metal oxide formation has sometimes been seen to cause issues with other substrate processing operations subsequent to electroplating. For instance, it has sometimes been observed that metal oxide formation impedes the deposition of post-electrodeposition capping layers. In some situations, this may be due to the metal oxide layer effectively limiting the adhesion if the capping layer.

It may be difficult to avoid metal oxide formation on the seed layer after it has been deposited but prior to the bulk electroplating operation. Various intervening processing steps may occur that expose the seed layer to oxygen or water vapor in ambient conditions. For example, a PVD method of deposition a metal seed layer may be followed by one or more steps of rinsing (with de-ionized water, for example) and then subsequent drying which is done prior to the bulk electrodeposition operation. The rinsing step may be limited to a time, for example, of between about 1 and 10 seconds, but may take a longer or shorter time. The subsequent drying may be between about 20 and 40 seconds, though the drying step may take a longer or shorter time. During these steps, the metal seed layer may be exposed to ambient conditions and oxidation of the seed layer may take place.

Even in the absence of a particular intervening step (like rinsing and drying) seed layer deposition, for example via PVD, is typically done in a different processing chamber than the electroplating cell used for electrodeposition. As such, there is oftentimes and intervening vacuum break and transfer of the wafer between these processing modules during which the seed layer may be exposed to ambient conditions, again, potentially resulting in seed layer oxidation. In some circumstances, the duration of this exposure may be anywhere between about 1 minute and 4 hours, or more particularly between about 15 minutes and 1 hour. Note that various suitable electro-plating/deposition/fill methods and apparatuses are described in U.S. Pat. No. 6,793,796, filed Feb. 28, 2001, which is hereby incorporated by reference in its entirety for all purposes. (The reference describes at least four phases of the electro-plating/deposition/fill process and discloses controlled current density methods for each phase for optimal filling of relatively small embedded features.)

Plasma Treatment to Remedy Oxidation of the Seed Layer

Due to the various factors that may result in metal seed layer oxidation in the intervening period between the seed layer's deposition and subsequent bulk electroplating, an effective prescription for reducing metal oxides post-seed layer deposition is highly desired. One approach is to pretreat (prior to bulk electroplating) the surface of the substrate by contacting it with a plasma which includes a reducing agent which thereby works to reduce the metal oxides formed on the substrate's surface. The reducing plasma used in this plasma pretreatment may be formed in the reaction chamber itself (the vacuum chamber holding the substrate for pretreatment), or the source of the plasma may be remote from the processing chamber—i.e., a "remote plasma" is formed and introduced into the processing chamber to contact and treat the substrate surface—though perhaps also subject to subsequent modification once it enters the reaction chamber (e.g., ion filtering so that radicals primarily contact the substrate, etc.).

Such methods and apparatuses for performing such an electroplating pre-treatment with a reducing plasma are described in detail in U.S. patent application Ser. No. 14/086,770 (the "'770 app."), filed Nov. 21, 2013, and titled "METHOD AND APPARATUS FOR REMOTE PLASMA TREATMENT FOR REDUCING METAL OXIDES ON A METAL SEED LAYER," now published as US Pat. Pub. No. 2014/0256128, which is hereby incorporated by reference in its entirety for all purposes. As disclosed in the '770 app., depending on the embodiment the reducing gas species used to form the reducing plasma may be hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$), and likewise, the energized reducing species in the plasma may be ions of the reducing gas or radicals such as $H^*$, $NH_2^*$, or $N_2H_3^*$.

Equation 3 shows an example of a reducing gas species such as hydrogen gas being broken down into hydrogen radicals. Equation 4 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 5.

$$H_2 \rightarrow 2H^* \quad \text{Equation 3:}$$

$$(x)2H^* + MOx \rightarrow M + (x)H_2O \quad \text{Equation 4:}$$

$$(x)H_2 + MOx \rightarrow M + (x)H_2O \quad \text{Equation 5:}$$

As mentioned, in some embodiments the pretreatment plasma may also include ions and other charged species of the reducing gas species, though it is often advantageous to filter out these charged species so they do not reach the substrate and potentially damage the seed layer as described in greater detail below.

Qualifying/Quantifying Plasma Pretreatment Performance

The foregoing plasma pretreatment has been found to be very effective at reducing the impact of seed aging on subsequent bulk electroplating. However, qualifying plasma pretreatment process performance in the field has been found to be extremely challenging. To qualify pretreatment performance, typically a wafer is oxidized in a controlled environment and then exposed to the oxide reducing plasma in a pretreatment module. Pre and post plasma treatment sheet resistance measurements are done and sheet resistance drop typically characterizes the performance of the plasma pretreatment. Even though this technique is useful in that, to a certain extent, it reveals the change pre and post plasma pretreatment, it is nevertheless plagued with many problems in the field. Since the sheet resistance measurements are done offline, there is a queue time between the plasma pretreatment and the offline measurements (which are done at a separate, dedicated metrology tool). Due to the queue time, the performance of the pretreatment (e.g., the extent of oxide removal) tends to systematically be underestimated. More significantly, random differences in queue time can be a false indication of pretreatment performance variability in the field. In some instances, if queue times after pretreatment are long enough, a pretreated wafer can regrow almost all the original oxide layer back before sheet resistance measurement is done. Thus, such offline ex situ techniques are not ideal for qualifying (and quantifying) performance of plasma pretreatment in the field where queue time between pretreatment and measurement cannot be tightly controlled and/or even predicted. What is desired (and disclosed herein) are online in situ measurement techniques for quantifying oxide layer thickness in real-time—during or immediately after plasma pretreatment—thus providing for a reliable characterization of plasma pretreatment performance. Plasma pretreatment modules implementing such techniques are desired (and disclosed herein) as well.

Estimating on-Wafer Oxide Layer Removal Effectiveness Via Color Sensing

One mechanism for evaluating the effectiveness of oxide layer removal is to estimate oxide layer thickness using a color sensor after and/or even during the plasma pretreatment operation. It has been discovered that color signal analysis measured from the wafer surface may be used as a basis of probing the thickness of any remaining oxide layer during or after plasma pretreatment. In some embodiments, color signal measurement and analysis may accurately evaluate the performance of a plasma pretreatment module, of example, detecting issues with the module as they arise and helping to prevent wafer scraps in the field. Thus, electroplating pretreatment methods which prepare a substrate for subsequent electroplating may include reducing metal oxides on the substrate's surface by contacting the surface with a plasma, and then measuring a color signal (from said surface), and estimating the extent of the oxide reduction (due to the plasma treatment) based on the color signal.

Such a method of preparing a semiconductor substrate having a metal seed layer for a subsequent electroplating operation is illustrated by the flowchart in FIG. 1A. As shown in the figure, such a method 100 begins with an operation 120 of contacting the surface of the semiconductor substrate with a plasma to treat the surface by reducing metal oxides thereon. Then, after contacting with the plasma, in operation 130, a post-plasma-contact color signal is measured from said surface. Such a color signal may have one or more color components as described further below. One or more of the color components may provide an indication of the thickness of the oxide layer. Thus, in operation 140, the measured post-plasma contact color signal is used as a basis for estimating the extent of the oxide reduction due to the plasma treatment.

Note that a color signal measured from the substrate surface typically has multiple color components (though it could have just one color component). Once a color sensor has been tuned and it's setup optimized, it can detect small color changes on the surface of the wafer. In some embodiments, a color sensor outputs a color signal consisting of three color components. These could be RGB (red/green/blue) color values, but color components defining something other than an RGB color space are also feasible.

Figure 2:
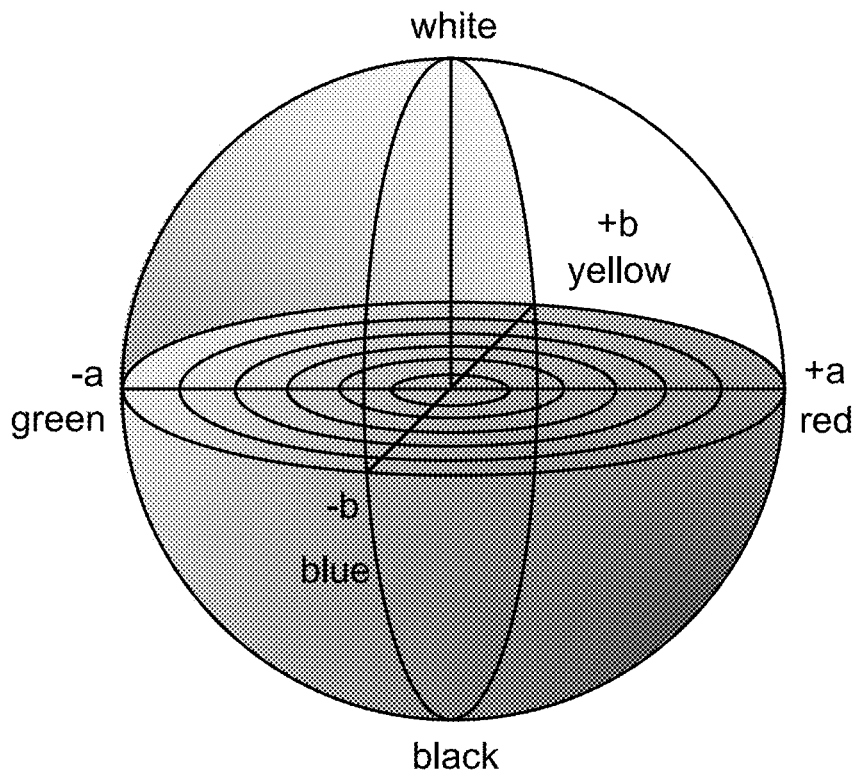
FIG. 2 schematically illustrates a three color component color space using "a*", "b*", and "L*" color components.

For example, in some embodiments, the set of L*, and b* color components are measured and output by a color sensor; and these L*, a*, b* color components define an L*/a*/b* color space, as schematically illustrated in FIG. 2. As shown in FIG. 2, the "a*" color component indicates the relative proportion of green to red in the color signal, the "b*" color component indicates the relative proportion of blue to yellow in the color signal, and the "L*" color component is indicative of the overall luminosity or brightness of the color signal. Of course, while a value of (a*,b*,L*) designates a position in this particular color space, one of ordinary skill in the art will recognize that other representations of color space are also feasible, and that the actual physical color designated by a particular (a*,b*,L*) triplet in this color space will be potentially designated by a different triplet value of color components in a different color space. Moreover, one of ordinary skill in the art will readily appreciate that the inventive concepts disclosed herein are not restricted to this particular representation of color space in terms of a*, b*, and L* components.

It is also feasible in principle to use more than three color components, such as 4, 5, 6, 7, 8, 9, 10, or 16 color components in the measurements and analysis, or a number of color components in a range spanning 8 to 16 color components, or 16 to 32 color components, or 32 to 64 color components, or 64 to 128 color components, or 128 to 256 color components. If 3 or less color components are used, these color components may be chosen to be any combination of the *a, *b, or *L color components illustrated schematically in FIG. 2, or a combination of other types of color components (whether one, two, three) such as, for example, RGB (red, green, blue) color components. It should also be noted that although it is generally the case that the probe and reference color signals would include the same type and number of color components, it is not necessarily required. A metric indicative of the difference between the two color signals (or between a measured signal and a vector average) having different numbers of color components could still be computed by ignoring the extra color components, for example. In yet other embodiments, the components of the probe color signal may represent different color space components than the components of the one or more reference color signals. If this is the case, various color space vector projection methods may be used to still formulate a meaningful comparison metric. Finally, it should also be noted that a device which senses colors and forms a color image—i.e., a color camera—may also, in principle, be used within the context of this disclosure. (Although, it is oftentimes the case that commercially available color cameras are not as sensitive to slight color differences as commercially available color sensors. Yet, in principle, a color camera may also be effective, depending on the embodiment and the desired sensitivity.)

With respect to this L*/a*/b* color space, it has been discovered that the b* color component is very effective upon which to base a determination of the extent of oxide reduction (and/or removal) during or after a plasma pretreatment operation. Partially, this is due to the difference in b* color values attributable to oxide versus bare metal seed, however (and without being limited to a particular theory), it is also due to the relative insensitivity of the b* color component to other irrelevant artifacts, fluctuations, instability, etc. during the color measurement. Some of the fluctuations and instabilities during color sensor measurements can be due to vibration, changes in light intensity, change in the gap between sensor head and the wafer, angle of the sensor head with respect to the wafer, wafer wobbling, and ambient condition changes including temperature, pressure, humidity, etc. The color sensor can have its own internal light source, however, small changes in the ambient light can interfere with the internal light source. For instance, the L* color component has been found to be quite dependent on the ambient light and hence not suitable as an indicator of the wafer color change due to oxide formation. The other color component, the a* component, has been found to not vary significantly between oxide and bare metal seed.

Note that the b* color component is defined herein to be the color component (e.g., of a multi-component color signal) which has a value indicative of the relative proportion of blue versus yellow in the color signal (as discussed above with respect to FIG. 2). There are many possible sets of color components which may define the color space measured by a particular color sensor. Some color sensor may only measure a single color component which could possibly be a b* color component. Some color sensors may measure more than 3 color components one of which is the b* color component. Furthermore, there may be some variation in what is measured and/or defined as the b* color component (the difference may be by design, or it may be due to unintentional manufacturing variation), even in sensor which measure 3 color components. Nevertheless, in any of these cases, if a measured color component is indicative of the proportion of blue versus yellow, it is encompassed herein by what is referred to as the b* color component.

In some embodiments, a color signal upon which determination of oxide reduction effectiveness is based is measured immediately after the plasma treatment finishes (or as soon afterwards as is practical). (How soon after may depend on the placement and/or mounting of the color sensor relative to where the plasma pretreatment occurs, though the idea is that it be near enough so that the problems discussed above with respect to the usual offline metrology are significantly reduced.) However, in other embodiments, the color signal upon which an oxide-removal-effectiveness determination is based may be measured during the plasma-based pretreatment oxide removal, or even at multiple times over the course of the pretreatment.

Such measurements may be used for real-time trouble spotting in the pretreatment process, so that problems may be rectified as soon as possible and minimize wafer loses. However, it is also noted that real-time oxide layer thickness measurement during pretreatment (particularly if done at various intervals over the course of pretreatment) may be used as a basis for real-time adjustment of the pretreatment process itself (e.g., by adjusting plasma strength) or for endpoint determination (i.e., determining when it advisable to stop the pretreatment process because all (or sufficient) oxide has been reduced and/or removed.

In any event, a variety of processing analysis options are then possible as far as what one does with this "post-plasma-contact color signal" in order to gauge oxide removal effectiveness. For instance, in some embodiments, the post-plasma-contact color signal may be compared to one or more reference color signals. If the reference color signals are indicative of particular levels of oxide thickness—e.g., they were measured from wafers of known oxide layer thickness—then comparing the measured post-plasma-contact color signal with these reference signals provides an estimate of oxide layer thickness (and thus oxide removal effectiveness).

In some embodiments, this comparison could entail identifying the reference color signal which is closest to the measured post-plasma contact color signal (the "probe" signal) and determining the oxide layer thickness to be that associated with this particular reference. If the comparison is based on a single color component, such as b* (or a single color band, say for example, 650 nm±some $\Delta\lambda$), then "closest" reference just means that whose value of that color component is least different than the probe signal. If the comparison is based on multiple color components, then the "closest" reference is that whose vector of color components is the least different form the probe, i.e., it has the smallest value of $$\Delta E = \sqrt{\sum_{i=1}^{N} \{c_i(\text{probe}) - c_i(\text{reference})\}^2}$$

where $c_i$ is the $i^{th}$ component of the probe (measured post-plasma-contact color signal) and reference color signals, and N is the number of color signal components (as is readily understood by one having ordinary skill in the art).

Of course, a differencing metric consisting of a scaled version of the magnitude of this vector difference would work similarly (the scaling possibly due to unit conversion, for example), as would various monotonic functions of the vector difference magnitude. One of ordinary skill in the art will readily appreciate that the specific functional form of the metric is not critical as long as it results in a value indicative of the difference between the probe and the reference color signals. The mathematical function representing the comparison metric could be implemented as an analytic function of the color signals, it could be implemented in a look-up table, or it could potentially be implemented using some other computational methodology (a mixture of analytic function evaluation and table look-up, for instance).

Since the b* color component has been determined to be quite probative of oxide layer thickness, in preferred embodiments, the comparisons would be done in terms of the b* components of the post-plasma-contact measured (probe) and reference color signals. Thus, an analysis based on the b* color component may involve calculating a set of metrics each of which is monotonically related to the absolute value of the difference between the b* component of the post-plasma-contact color signal and the b* component of a reference color signal (corresponding to an oxide layer of known thickness).

In more complicated embodiments, the oxide layer thickness could be determined by interpolating between reference color signals (corresponding to known oxide layer thicknesses). In some embodiments, multiple sets of color signals measured from multiple sets of reference wafers having known oxide layer thicknesses may be used to develop a functional relationship between color signal and oxide layer thickness, and this relationship may be used to estimate the oxide layer thickness of the test wafer based on the color signal measured from its surface (and thereby the effectiveness of the plasma pretreatment procedure). This functional relationship between oxide layer thickness and color signal could be linear, or roughly linear, or nonlinear, depending on the scenario. The functional relationship will never be exact, of course, but a best fit functional relationship may be selected or determined from one or more trial functional forms fit to a given set of data (i.e. color signal measurements from reference wafers of known oxide layer thicknesses). The best fit will presumably establish values for one or more parameters associated with the functional form as is readily appreciated by one having skill in the art (e.g., the slope and intercept of a line if the functional relationship is assumed to be linear). Of course, as will also be appreciated by one having ordinary skill in the art, once a functional relationship between color signal and oxide thickness is determined (whether it be linear, non-linear, etc.), the function may be applied to a measured color signal via analytic function evaluation, look-up table, etc. to calculate an approximate seed layer thickness.

Another set of color signal processing options may base the analysis of pretreatment effectiveness on a comparison of one more color signals measured post-plasma-contact against one or more color signals measured before the plasma pretreatment. Such a method of preparing a semiconductor substrate having a metal seed layer for a subsequent electroplating operation is illustrated by the flowchart in FIG. 1B. As shown in the figure, such a method 105 begins with an operation 110 of measuring, before contacting with the plasma, a pre-plasma-contact color signal from the surface of a semiconductor substrate. Operation 130 follows where the surface of the substrate is contacted with a plasma to treat the surface by reducing metal oxides thereon. Then, as in method 100 from FIG. 1A, after the plasma contact, a post-plasma-contact color signal is measured from said surface in operation 130. Estimation of the extent of oxide reduction due to the plasma treatment is then done in operation 145, which then is done by comparing the pre- and post-plasma-contact color signals.

As with the post-plasma-contact color signal (or signals), a pre-plasma-contact color signal may have one or more color components and, in particular, may include a b* component. In some embodiments, a pre-versus-post plasma contact color signal comparison may involve the calculation a metric which is indicative of the difference between the pre- and post-plasma-contact color signals. More particularly, if the b* component is used as the basis of comparison, the metric may be monotonically related to the absolute value of the difference between the b* component of the pre- and post-plasma-contact color signals.

Color sensor measurements for evaluating plasma pretreatment effectiveness has been found workable in well-controlled vacuum environments (such as in the plasma processing chamber) as well as in ambient environments (such as within a chamber's inbound and outbound load-locks, as described in greater detail below). It has been found, however, that color signal measurement does work best when the head of the color sensor is close to the wafer's surface—i.e., only a small gap between sensor and wafer (as described further below). This leads to the most stable measurements with the best signal-to-noise ratio. Further details regarding placement and/or mounting of the color sensor with respect to the plasma processing chamber are described in greater detail below.

Further Details Regarding Plasma Treatment of the Seed Layer

Figure 1B:
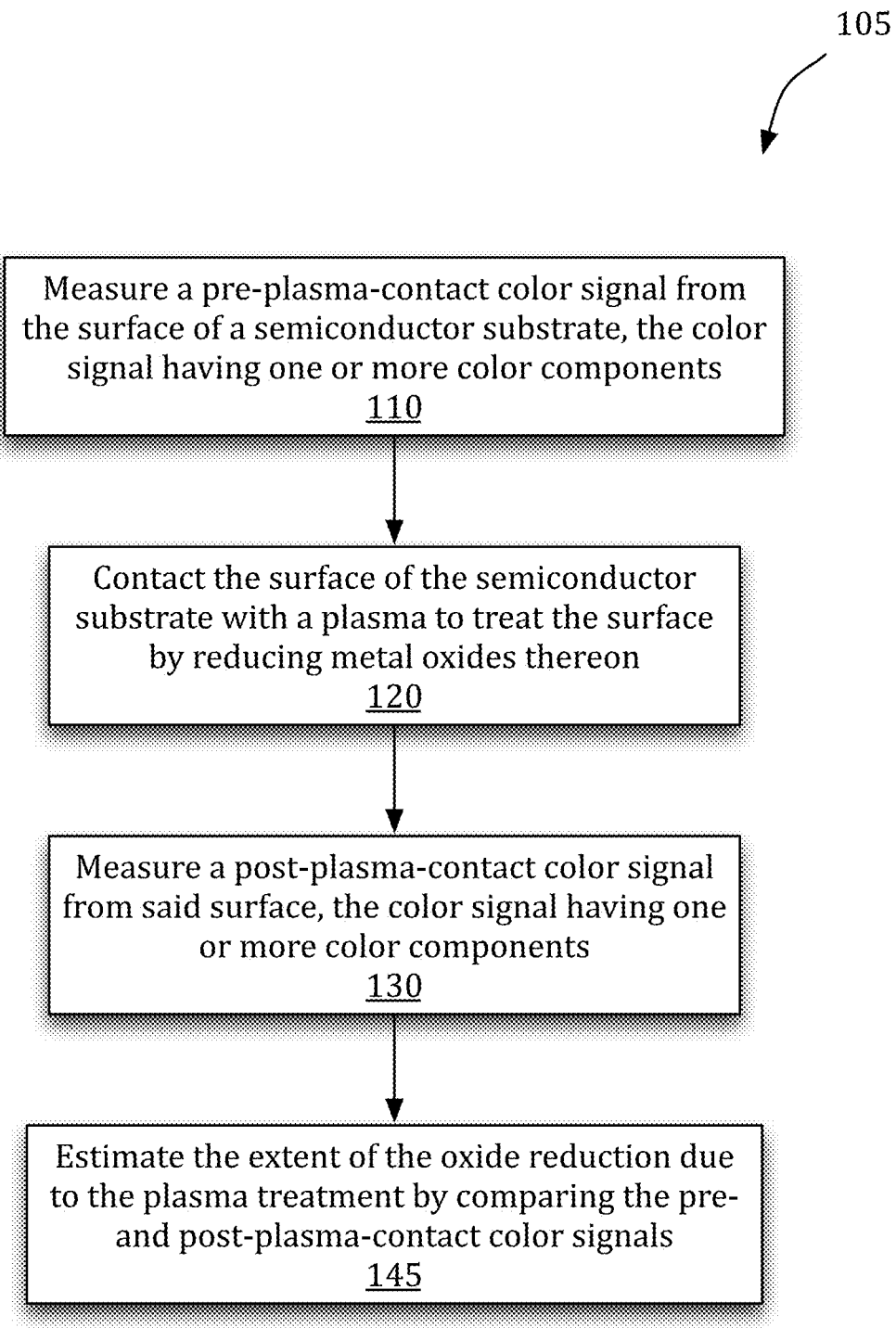
FIG. 1B is a flowchart of another method of preparing a semiconductor substrate having a metal seed layer for a subsequent electroplating operation involving the measurement of at least two color signals.
Figure 3:
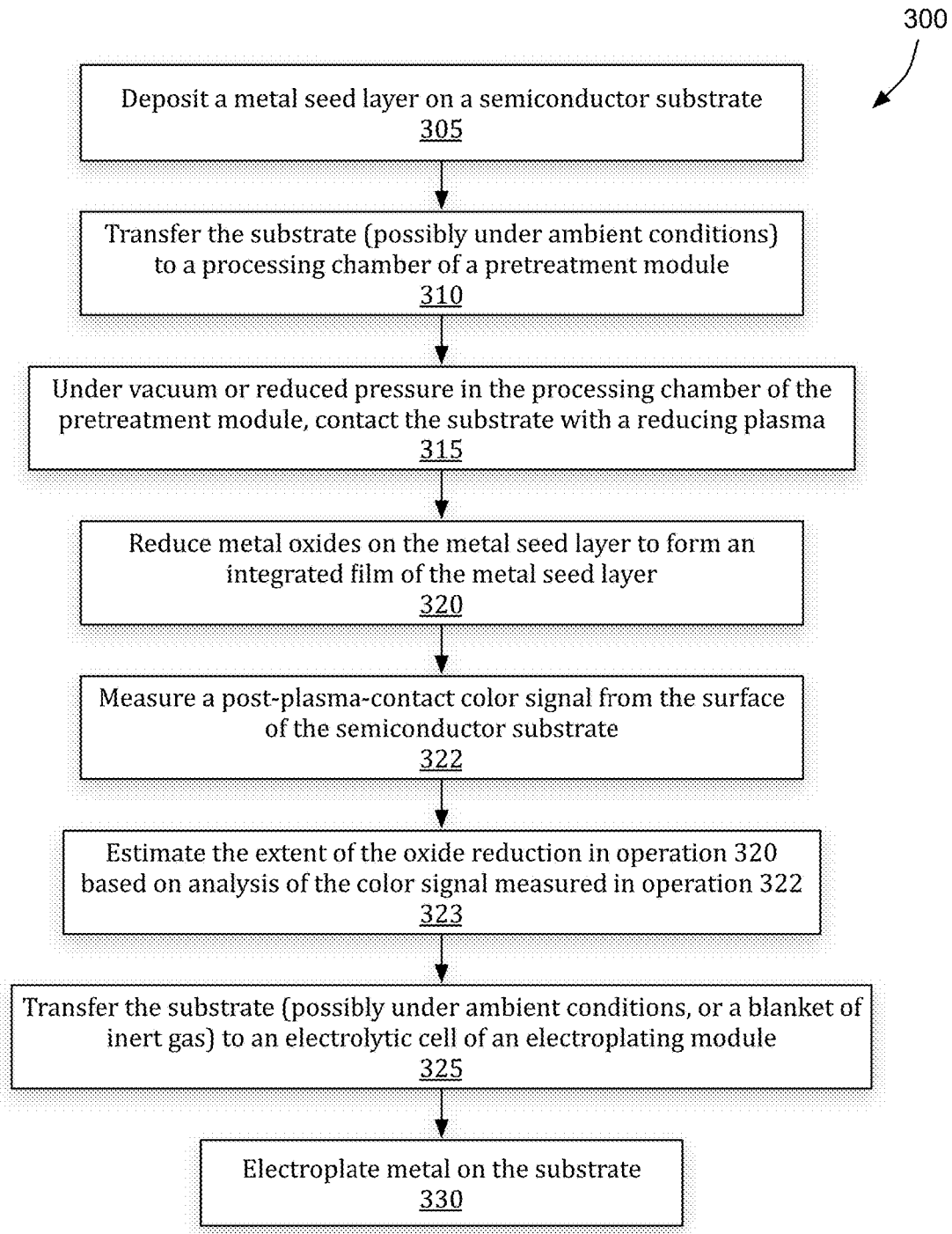
FIG. 3 presets a more detailed flowchart illustrating an electroplating method including a plasma pretreatment and operations for estimating the extent of oxide reduction in the pretreatment akin to the operations shown in FIGS. 1A and 1B.

FIG. 3 presets a more detailed flowchart illustrating an electroplating method which includes plasma pretreatment and operations for estimating the extent of oxide reduction in the pretreatment akin to the operations shown in FIGS. 1A and 1B. The method 300 begins with operation 305 where a metal seed layer (such as a thin copper layer) is deposited on a substrate. This provides a substrate having the metal seed layer on a plating surface of the substrate. The substrate may have recesses having height to width aspect ratios of greater than about 3:1 or greater than about 5:1. At operation 310, the substrate is transferred (possibly under ambient conditions) to a processing chamber, say of a pretreatment module. At operation 315, under vacuum or reduced pressure in the processing chamber, the substrate is contacted with a reducing plasma (having ions and/or radical species of a reducing gas species formed in the processing chamber or remote from it as described above). (The radical and ion species may drift freely toward the surface of the substrate; ions, in particular, may be accelerated by an applied voltage bias, for example between a showerhead and the substrate holder/pedestal.) This treatment results, at operation 320, with the reduction of oxides on the metal seed layer and the formation of an un-oxidized (or nearly so) metallic surface. In some embodiments, as indicated in the figure, what was oxidized metal becomes an integrated film on the metal seed layer.

After oxide reduction, the next two operations involve estimation of the extent of oxide reduction based on color signal measurement. In particular, in operation 322 a post-plasma contact color signal is measured from the surface of the substrate. Then, again similar to FIGS. 1A and 1B, the extent of the oxide reduction (accomplished in operation 320) is estimated in operation 323 based on analysis of the color signal measured in operation 322. The method then proceeds to operation 325 where the substrate is transferred under ambient conditions or under a blanket of inert gas to the electroplating system (or electroless plating system, other metal deposition system, or another pretreatment apparatus). Though metal oxides in the metal seed layer have been substantially reduced by exposing the metal oxide surfaces to a reducing gas atmosphere, performing operation 325 may present an additional challenge of re-oxidation from exposure to the ambient environment. In some embodiments, exposure to ambient conditions may be minimized using techniques such as shortening the duration of transfer or controlling the atmosphere during transfer. Additionally or alternatively, the transfer is conducted in a controlled environment that is less oxidizing than ambient conditions. To control the atmosphere during transfer, for example, the atmosphere may be substantially devoid of oxygen. The environment may be substantially inert and/or be low pressure or vacuum. In some embodiments, the substrate may be transferred under a blanket of inert gas. As discussed below, the transfer in operation 325 may occur from the plasma pretreatment chamber to an electroplating cell in the same apparatus, or two apparatuses (plasma treatment and electroplating) which are somewhat separated, but are nevertheless connected and integrated with one another so that the substrate pretreated with reducing plasma may be transferred to the electroplating cell with reduced, or minimal, or no exposure to conditions which would cause oxidation of its now substantially bare metal surface. In any event, once transferred at operation 325 in FIG. 3, the method concludes with operation 330 wherein metal is finally electroplated on to the substrate surface, in particular, and in preferred embodiments, onto what is now a bare, substantially unoxidized metal seed layer on the substrate surface.

The pretreatment plasma may also generate and include UV radiation from the reducing gas species. In some embodiments UV photons may heat the surface of the substrate to activate the metal oxide surface for subsequent reduction, or in some cases, the UV photons may have sufficient energy to cause reduction of the metal oxide itself. Thus, in some embodiments, radicals or ions of the reducing gas species, UV radiation from (neutrals, ions, and/or radicals of) the reducing gas species, or the reducing gas species itself can reduce the metal oxide.

In addition, the activated (ions, radicals, etc.) reducing gas species can be combined with mixing gas species, such as relatively inert gas species. Examples of relatively inert gas species can include nitrogen ($N_2$), helium (He), neon (Ne), krypton (Kr), xenon (Xe), radon (Rn), and argon (Ar). The flow rate of the reducing gas species for forming the reducing plasma can vary depending on the size of the wafer for processing. For example, said flow rate may be between about 10 standard cubic centimeter per minute (sccm) and about 100,000 sccm for processing a single 450 mm wafer. Other wafer sizes can also apply. For example, the flow rate of the reducing gas species used to form the plasma may be between about 500 sccm and about 30,000 sccm for processing a single 300 mm wafer.

Temperature and pressure also affect the reactivity of the reducing plasma, although the temperature is typically maintained below that which produces agglomeration of the metal seed layer during exposure to the reducing gas atmosphere. As disclosed in the '770 app., suitable temperatures and pressures may be as follows: The temperature of the reducing chamber can be relatively high to permit the dissociation of reducing gas species into radicals. For example, the reducing chamber can be anywhere between about 10 and 500° C., such as between about 50 and 250° C. Higher temperatures may be used to speed up metal oxide reduction reactions and shorten the duration of exposure to the reducing gas atmosphere. In some embodiments, the reducing chamber can have a relatively low pressure to substantially remove any oxygen from the reducing gas atmosphere, as minimizing the presence of oxygen in the atmosphere can reduce the effects of re-oxidation. For example, the reducing chamber can be pumped down to a vacuum environment or a reduced pressure of between about 0.1 Torr and about 50 Torr. The increased temperature and/or the reduced temperature can also increase reflow of metal atoms in the metal seed layer to create a more uniform and continuous metal seed layer.

In some embodiments, as described in the '770 app., substrate temperature may be controlled separately from pretreatment chamber temperature in order to avoid or reduce damage to the metal seed layer. Depending on the type of metal in the metal seed layer, the metal can begin to agglomerate above a threshold temperature. The effects of agglomeration is more pronounced in relatively thin seed layers, especially in seed layers having a thickness less than about 100 Å. Agglomeration includes any coalescing or beading of a continuous or semi-continuous metal seed layer into beads, bumps, islands, or other masses to form a discontinuous metal seed layer. This can cause the metal seed layer to peel away from the surface upon which it is disposed and can lead to increased voiding during plating. For example, the temperature at which agglomeration begins to occur in copper is greater than about 100° C. Different agglomeration temperatures may be appropriate for different metals.

In some embodiments, the substrate can be maintained at a temperature between about −10° C. and about 150° C. In copper seed layers, for example, the substrate can be maintained at a temperature between about 75° C. and about 100° C. In cobalt seed layers, the substrate can be maintained at a temperature greater than about 100° C. Thus, a cooling system such as an actively cooled pedestal and/or gas flow cooling apparatus in the pretreatment chamber may be used to keep the local area of the substrate at temperatures below the agglomeration temperature. Depending on the embodiment, heat transfer may occur via conduction, convection, radiation, or combinations thereof. In some embodiments, a cooling fluid circulation loop may actively cool the substrate. Embodiments including cooling features are described in U.S. Pat. No. 7,327,948, issued Feb. 5, 2008; U.S. Pat. No. 7,941,039, issued Jan. 5, 2011; U.S. patent application Ser. No. 11/751,584, filed May 21, 2007; U.S. patent application Ser. No. 13/370,579, filed Feb. 10, 2012; U.S. Pat. No. 8,137,465, issued Mar. 20, 2012; U.S. patent application Ser. No. 11/129,266, filed May 12, 2005; U.S. patent application Ser. No. 11/546,189, filed Oct. 10, 2006; and U.S. patent application Ser. No. 12/749,170, filed Mar. 29, 2010; each of which is incorporated herein by reference in its entirety and for all purposes.

The duration of the plasma pretreatment may vary depending on the other process parameters, as described in detail in the '770 app. For example, exposure duration may be shortened by increasing plasma power, temperature, etc. Depending on the embodiment, suitable durations may be between about 1 and 60 minutes. For example, for pretreatment of copper seed layers, the duration of the exposure may be between about 10 and 300 seconds.

In addition, as described in the '770 app., plasma pretreatment may provide the additional benefit of causing a reflowing of the metal in the portion of the seed layer which has been reduced by the pretreatment back to its elemental (non-oxidized) state. This reflow process may work to reduce voids and gaps in the metal seed layer by mobilizing and redistributing the metal atoms which improves seed coverage and/or smoothness, and thereby forms a more uniform and continuous metal seed layer. In some implementations, the metal in the metal seed layer may be reflowed as a result of exposure to one or more of increased temperature, reduced pressure, exposure to UV radiation from a dedicated UV source, exposure to UV radiation generated by the reductive plasma, and/or exposure to radicals and/or ions in the plasma, which are thought (not being limited to a particular theory) to cause the metal atoms to enter a more excited state and thereby become more mobile. Furthermore, this reflowing may cause an integration of the metal reduced via the pretreatment (i.e., recovered from the metal oxide layer) to for a film integrated with the portion of the metal seed layer which was never oxidized. This film may be substantially continuous and conformal over the contours metal seed layer with the underlying portion of the seed layer which was never oxidized. As such, this reclaimed metal film resists delamination and the like, which is oftentimes seen to occur when oxide are eliminated by other techniques.

Color Sensor-Equipped Plasma Treatment Apparatuses

Disclosed are plasma treatment apparatuses for reducing metal oxides present on the surface of a metal seed layer of a semiconductor substrate in preparation for a subsequent electroplating operation. The apparatuses include a processing chamber having at least one processing station therein, a substrate holder configured to hold a substrate at the processing station, a plasma generator (configured to generate a plasma within and/or provide it to the processing chamber), and a controller having non-transitory computer-readable instructions for operating the apparatus. The controller's instructions may include instructions for operating the plasma generator to generate a plasma within the processing chamber. In some embodiments, the instructions cause the plasma to be generated remotely from the processing chamber (as described further below) and then provided to the processing chamber. In any event, execution of the plasma generating (and any related) instructions result in the plasma contacting the surface of a substrate at the processing station to treat it by reducing metal oxides thereon. However, in addition to the foregoing features, the plasma treatment apparatuses (electroplating pretreatment apparatuses) disclosed herein further include a color sensor for, in conjunction with the controller, providing real-time in situ estimation (and in some cases, continuous monitoring) of the performance of the plasma pretreatment apparatuses.

Thus, the controller may execute instructions for substrate processing operations analogous to those operations described above: Operating the plasma generator to generate a plasma within and/or provide it to the processing chamber so that the plasma contacts the surface of a substrate at the processing station to treat it by reducing metal oxides thereon; operating the color sensor, after the plasma contacts the substrate surface, to measure a post-plasma-contact color signal from the surface, the color signal having one or more color components; estimating the extent of the oxide reduction due to the plasma treatment based on the post-plasma contact color signal. Additional operations which may be performed by the controller include, but are not limited to: providing the semiconductor substrate to the processing station within the processing chamber, operating a remote plasma source in the plasma generation operation, controlling exposure of the substrate's oxidized metal seed layer to the plasma, etc.

The color sensor may be positioned/located/mounted at various positions within the plasma treatment apparatus. For instance, in some embodiments, the color sensor may be positioned/located/mounted within the plasma processing chamber itself so that the sensor may be configured to measure a color signal (or signals) from a substrate while the substrate is located at the processing station (within the chamber) for plasma treatment. In other embodiments, the color sensor may be positioned/located/mounted within the apparatus's inbound or outbound load-locks (which provides substrate access to and from the plasma processing chamber). In this sort of arrangement, a post-plasma-contact color signal (or signals) may be measured in situ by a color sensor located in the outbound load-lock, and thus provide an estimate of plasma pretreatment effectiveness, albeit not in real-time during the plasma treatment. Additionally, however, if another color sensor is mounted in the inbound load-lock, a pre-plasma-contact color signal may be measured, additionally, before the plasma treatment, and thus a comparison of pre and post plasma contact color signals provides a before-and-after basis for evaluating oxide removal effectiveness.

The hardware assembly of the color sensor, in some embodiments, may include a fiber optic sensor head and a sensor body; and the sensor body may contain a color signal processing module having computer-readable instructions for processing color signals. Thus the foregoing discussion of color sensor positioning/mounting applies more precisely to the fiber optic head of the color sensor. This is described further below in relation to various figures. Before those details, first described are various other aspects of the plasma processing apparatus: One interesting aspect is a showerhead feature of the plasma processing apparatus which is located between the plasma source and the semiconductor substrate. In some embodiments, it is desired that primarily free-radicals in the plasma contact the substrate and reduce oxides thereon—as opposed to ions in the plasma—and the showerhead feature described below may work to filter out plasma ions, so that only plasma free-radicals reach the surface of the substrate.

Figure 4:
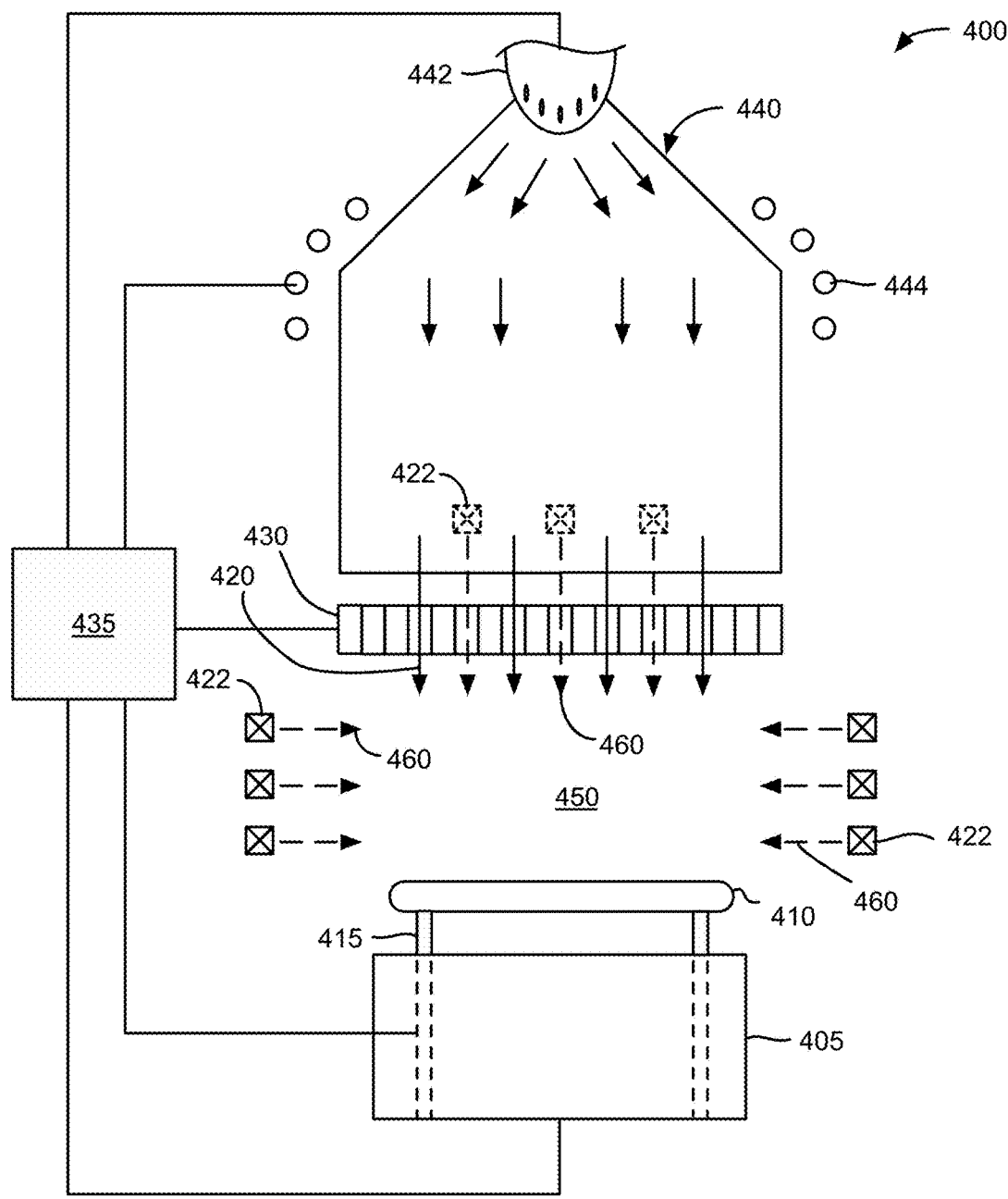
FIG. 4 shows a cross-sectional schematic of an example of a plasma treatment apparatus.

FIG. 4 shows a cross-sectional schematic of an example of a plasma treatment apparatus. The plasma treatment apparatus 400 includes a processing chamber 450 which has a single substrate processing station—as provided by substrate holder 405 (which may be a pedestal) for holding substrate 410. The plasma treatment apparatus 400 also includes a plasma generator configured to generate a plasma. Here, remote plasma source 440 generates the plasma remotely and thereafter provides it to the processing chamber through showerhead 430 (which is located between the substrate 410 and the remote plasma source 440). However, in other embodiments, the plasma generator may generate the plasma from within the processing chamber itself.

A reducing gas species 420 can flow from the remote plasma source 440 towards the substrate 410 through the showerhead 430. A remote plasma may be generated in the remote plasma source 440 to produce radicals of the reducing gas species 420. The remote plasma may also produce ions and other charged species of the reducing gas species. For example, coils 444 may surround the walls of the remote plasma source 440 and generate a remote plasma in the remote plasma source 440.

The remote plasma may further generate photons, such as UV radiation, from the reducing gas species. In some implementations, the plasma treatment apparatus can further include a UV source. The UV source can include UV broadband lamps such as mercury lamps, UV excimer lamps, UV excimer lasers, and other appropriate UV sources. Aspects of the UV source can be described in U.S. patent application Ser. No. 13/787,499, filed Mar. 6, 2013, which is incorporated herein by reference in its entirety and for all purposes. In some implementations, the reducing gas species can be exposed to UV radiation from the UV source to form radicals and other charged species of the reducing gas species, which can react with a metal oxide surface of a metal seed layer to reduce metal oxide.

In some embodiments, the coils 444 may be in electrical communication with a radio frequency (RF) power source or microwave power source. An example of a remote plasma source 440 with an RF power source can be found in the GAMMA®, manufactured by Lam Research Corporation of Fremont, Calif. Another example of an RF remote plasma source 440 can be found in the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used with the remote plasma source 440, as found in the Astex®, also manufactured by MKS Instruments. A microwave plasma can be configured to operate at a frequency of 2.45 GHz.

In embodiments with an RF power source, the RF generator may be operated at any suitable power to form a plasma of a desired composition of radical species. Examples of suitable powers include, but are not limited to, powers between about 0.5 kW and about 6 kW. Likewise, the RF generator may provide RF power of a suitable frequency, such as 13.56 MHz for an inductively-coupled plasma.

Reducing gas species 420 are delivered from a gas inlet 442 and into an internal volume of the remote plasma source 440. The power supplied to the coils 444 can generate a remote plasma with the reducing gas species 420 to form radicals of the reducing gas species 420. The radicals formed in the remote plasma source 440 can be carried in the gas phase towards the substrate 410 through the showerhead 430. An example of a remote plasma source 440 with such a configuration can be described in U.S. Pat. No. 8,084,339, issued Dec. 27, 2011, which is incorporated herein by reference in its entirety and for all purposes. The radicals of the reducing gas species 420 can reduce metal oxides on the surface of the substrate 410.

In addition to radicals of the reducing gas species, the remote plasma can also generate and include ions and other charged species of the reducing gas species 420. In some embodiments, the remote plasma may include neutral molecules of the reducing gas species 420. Some of the neutral molecules may be recombined molecules of charged species from the reducing gas species 420. The neutrals or recombined molecules of the reducing gas species 420 can also reduce metal oxides on the surface of the substrate 410, though they may take longer to react and reduce the metal oxides than the radicals of the reducing gas species 420. The ions may drift to the surface of the substrate 410 and reduce the metal oxides, or the ions may be accelerated toward the surface of the substrate 410 to reduce the metal oxides if the substrate support 405 has an oppositely charged bias. Having species with higher ion energies can allow deeper implantation into the metal seed layer to create metastable radical species further from the surface of the substrate 410. For example, if the substrate 410 has high aspect ratio features, such as between about 10:1 and about 60:1, ions with higher ionic energies may penetrate deeper into such features to provide reduction of the metal oxide more throughout the features. In contrast, some of the radicals of the reducing gas species 420 from remote plasma generation may recombine in the field or near the top of the features. The ions with higher ionic energies (such as 10 eV-100 eV) can also be used to re-sputter and reflow the metal in the metal seed layer, which can result in a more uniform seed coverage and reduce the aspect ratio for subsequent plating or metal deposition (such as PVD, CVD, ALD).

In FIG. 4, the plasma treatment apparatus 400 may actively cool or otherwise control the temperature of the substrate 410. In some embodiments, it may be desirable to control the temperature of the substrate 410 to control the rate of the reduction reaction and the uniformity of exposure to the remote plasma during processing. It may also be desirable to control the temperature of the substrate 410 to reduce the effects of oxidation on the substrate 410 before, during, and/or after processing.

In some embodiments, the plasma treatment apparatus 400 can include movable members 415, such as lift pins, that are capable of moving the substrate 410 away from or towards the substrate support 405. The movable members 415 may contact the lower surface of the substrate 410 or otherwise pick up the substrate 410 from the substrate support 405. In some embodiments, the movable members 415 may move the substrate 410 vertically and control the spacing between the substrate 410 and the substrate support 405. In some embodiments, the movable members 415 can include two or more actuatable lift pins. The movable members 415 can be configured to extend between about 0 inches and about 5 inches, or more, away from the substrate support 405. The movable members 415 can extend the substrate 410 away from a hot substrate support 405 and towards a cool showerhead 430 to cool the substrate 410. The movable members 415 can also retract to bring the substrate 410 towards a hot substrate support 405 and away from a cool showerhead 430 to heat the substrate 410. By positioning the substrate 410 via the movable members 415, the temperature of the substrate 410 can be adjusted. When positioning the substrate 410, the showerhead 430 and the substrate support 405 can be held at a constant temperature.

In some embodiments, the plasma treatment apparatus 400 can include a showerhead 430 that allows for control of the showerhead temperature. An example of a showerhead configuration that permits temperature control can be described in U.S. Pat. No. 8,137,467, issued Mar. 20, 2012, and U.S. Patent Publication No. 2009/0095220, published Apr. 16, 2009, both of which are incorporated herein by reference in their entirety and for all purposes. Another example of a showerhead configuration that permits temperature control can be described in U.S. Patent Publication No. 2011/0146571, published Jun. 23, 2011, which is incorporated herein by reference in its entirety and for all purposes. To permit active cooling of the showerhead 430, a heat exchange fluid may be used, such as deionized water or a thermal transfer liquid manufactured by the Dow Chemical Company in Midland, Mich. In some embodiments, the heat exchange fluid may flow through fluid channels (not shown) in the showerhead 430. In addition, the showerhead 430 may use a heat exchanger system (not shown), such as a fluid heater/chiller to control temperature. In some embodiments, the temperature of the showerhead 430 may be controlled to below about 30° C., such as between about 5° C. and about 20° C. The showerhead 430 may be cooled to reduce damage to the metal seed layer that may result from excess heat during processing of the substrate 410. The showerhead 430 may also be cooled to lower the temperature of the substrate 410, such as before and after processing the substrate 410.

In some embodiments, the showerhead 430 may include a plurality of holes. Increasing the size and number of holes in the showerhead 430 and/or decreasing the thickness of the showerhead 430 may permit greater flow of radicals, ions, and UV radiation from the reducing gas species 420 through the showerhead 430. Exposing the metal seed layer to more radicals, ions, and UV radiation can provide more UV exposure and energetic species to reduce metal oxide in the metal seed layer. In some embodiments, the showerhead 430 can include between about 100 and about 900 holes. In some embodiments, an average diameter of the holes can be between about 0.05 and about 0.5 inches. This can result in an open area in the showerhead 430 due to holes of between about 3.7% and about 25%. In some embodiments, the showerhead 430 can have a thickness between about 0.25 and about 3.0 inches.

In some embodiments, the substrate support 405 may be configured to move to and away from the showerhead 430. The substrate support 405 may extend vertically to control the spacing between the substrate 410 and the showerhead 430. When reducing metal oxides on the substrate 410, the uniformity as well as the rate of the reduction on the substrate 410 may be tuned. For example, if the substrate support 405 is closer to the showerhead 430, reduction of the metal oxide on the surface of the substrate 410 may proceed faster. However, the center of the substrate 410 may get hotter than the edges of the substrate 410, which can result in a less uniform reduction treatment. Accordingly, the spacing between the substrate 410 and the showerhead 430 can be adjusted to obtain a desired rate and uniformity for processing the substrate 410. In some embodiments, the substrate support 405 can be configured to extend between about 0 inches and about 5 inches, or greater than about 5 inches, from the showerhead 430.

In some embodiments, the temperature of the substrate support 405 may also be adjusted. In some embodiments, the substrate support 405 can be a pedestal with one or more fluid channels (not shown). The fluid channels may circulate a heat transfer fluid within the pedestal to actively cool or actively heat the pedestal, depending on the temperature of the heat transfer fluid. Embodiments that include such fluid channels and heat transfer fluids can be described in actively cooled pedestal systems discussed earlier herein. The circulation of the heat transfer fluid through one or more fluid channels can control the temperature of the substrate support 405. Temperature control of the substrate support 405 can control the temperature of the substrate 410 to a finer degree. In some embodiments, the temperature of the substrate support 405 can be adjusted to be between about 0° C. and about 400° C.

In some embodiments, the plasma treatment apparatus 400 can include one or more gas inlets 422 to flow cooling gas 460 through the processing chamber 450. The one or more gas inlets 422 may be positioned above, below, and/or to the side of the substrate 410. Some of the one or more gas inlets 422 may be configured to flow cooling gas 460 in a direction that is substantially perpendicular to the surface of the substrate 410. In some embodiments, at least one of the gas inlets 422 may deliver cooling gas 460 through the showerhead 430 to the substrate 410. Some of the one or more gas inlets 422 may be parallel to the plane of the substrate 410, and may be configured to deliver a cross-flow of cooling gas 460 across the surface of the substrate 410. In some embodiments, the one or more gas inlets 422 may deliver cooling gas 460 above and below the substrate 410. The flow of cooling gas 460 across the substrate 410 can enable rapid cooling of the substrate 410. Rapid cooling of the substrate 410 can reduce the oxidation of the metal seed layer in the substrate 410. Such cooling of the substrate 410 may take place before and after processing of the substrate 410. The flow rate of the cooling gas 460 for cooling can be between about 0.1 standard liters per minute (slm) and about 100 slm.

Examples of cooling gas 460 can include a relatively inert gas, such as nitrogen, helium, neon, krypton, xenon, radon, and argon. In some embodiments, the cooling gas 460 can include at least one of nitrogen, helium, and argon.

In some embodiments, the cooling gas 460 can be delivered at room temperature, such as between about 10° C. and about 30° C. In some embodiments, the cooling gas 460 can be delivered at a temperature less than room temperature. For example, a cold inert gas may be formed by expanding a cold liquid to gas, such as liquid argon, helium, or nitrogen. Thus, the temperature range of the cooling gas 460 used for cooling can be broadened to be anywhere between about −270° C. and about 30° C.

In some embodiments, the plasma treatment apparatus 400 may be part of or integrated with an electroplating apparatus (not shown). Oxidation of the metal seed layer in the substrate 410 can occur rapidly during exposure to ambient conditions. By attaching or otherwise connecting the plasma treatment apparatus 400 to the electroplating apparatus, the duration of exposure to ambient conditions of the substrate 410 can be reduced. For example, the transfer time between the plasma treatment apparatus following treatment and the electroplating apparatus can be between about 15 seconds and about 90 seconds, or less than about 15 seconds.

Table I summarizes exemplary ranges of process parameters that can be used with certain embodiments of a plasma treatment apparatus 400.

TABLE I

| Parameter | Parameter Range |
|---|---|
| Pedestal Temperature | 0° C.-400° C. |
| Showerhead Temperature | 5° C.-30° C. |
| Pedestal Dropping Vertical Travel | 0"-5" |
| Lift Pins Raising Vertical Travel | 0"-5" |
| Cooling Gas Flow ($N_2$/Ar/He-pure or mixture) | 0.1-100 slm |
| Cooling Gas Temperature | −270° C.-30° C. |
| Process Gas Flow ($H_2$/He/$NH_3$-pure or mixture) | 0.5 slm-30 slm |
| Process Pressure | 0.5-6 Torr |
| Venting Gas Flow | Nominally same as cooling gas |
| Venting Gas | Nominally same as cooling gas |
| RF Plasma Power | 0.5-6 kW |
| Plasma treatment apparatus to Electroplating Apparatus Transfer Time | 15-90 seconds |
| Showerhead hole number | 100-900 |
| Showerhead thickness | 0.25"-3.0" |
| Showerhead hole diameter | 0.05"-0.5" |
| Showerhead open area due to holes | 3.7%-25% |

A controller 435 may contain instructions for controlling parameters for the operation of the plasma treatment apparatus 400. The controller 435 will typically include one or more memory devices and one or more processors. The processor may include a CPU or computer, analog and/or digital input/output connections, stepper motor controller boards, etc. The plasma treatment apparatus can be configured to perform a plurality of operations that is not limited to treating a substrate with a remote plasma. The plasma treatment apparatus can be configured to transfer (such as load/unload) a substrate efficiently to and from an electroplating apparatus, electroless plating apparatus, or other metal deposition apparatus. The plasma treatment apparatus can be configured to efficiently control the temperature of the substrate by positioning the substrate using movable members and/or the using substrate support. The plasma treatment apparatus can be configured to efficiently control the temperature of the substrate by controlling the temperature of the substrate support and the temperature of the showerhead. The plasma treatment apparatus can be configured to tune the rate of reduction reaction and the uniformity of the reduction reaction by positioning the substrate support relative to the showerhead. The plasma treatment apparatus can be configured to control the environmental conditions surrounding the substrate by controlling the gases and flow rates of the gases delivered into the processing chamber. Such operations can improve the processing of the substrate while also integrating additional operations into a single standalone apparatus. Thus, a single apparatus can be used for treating and cooling the substrate, rather than using two separate modules. Furthermore, by configuring the plasma treatment apparatus to be able to perform some of the operations described above, the plasma treatment apparatus can reduce potential oxidation of the metal seed layer before, during, and after processing of the substrate.

Figure 5A:
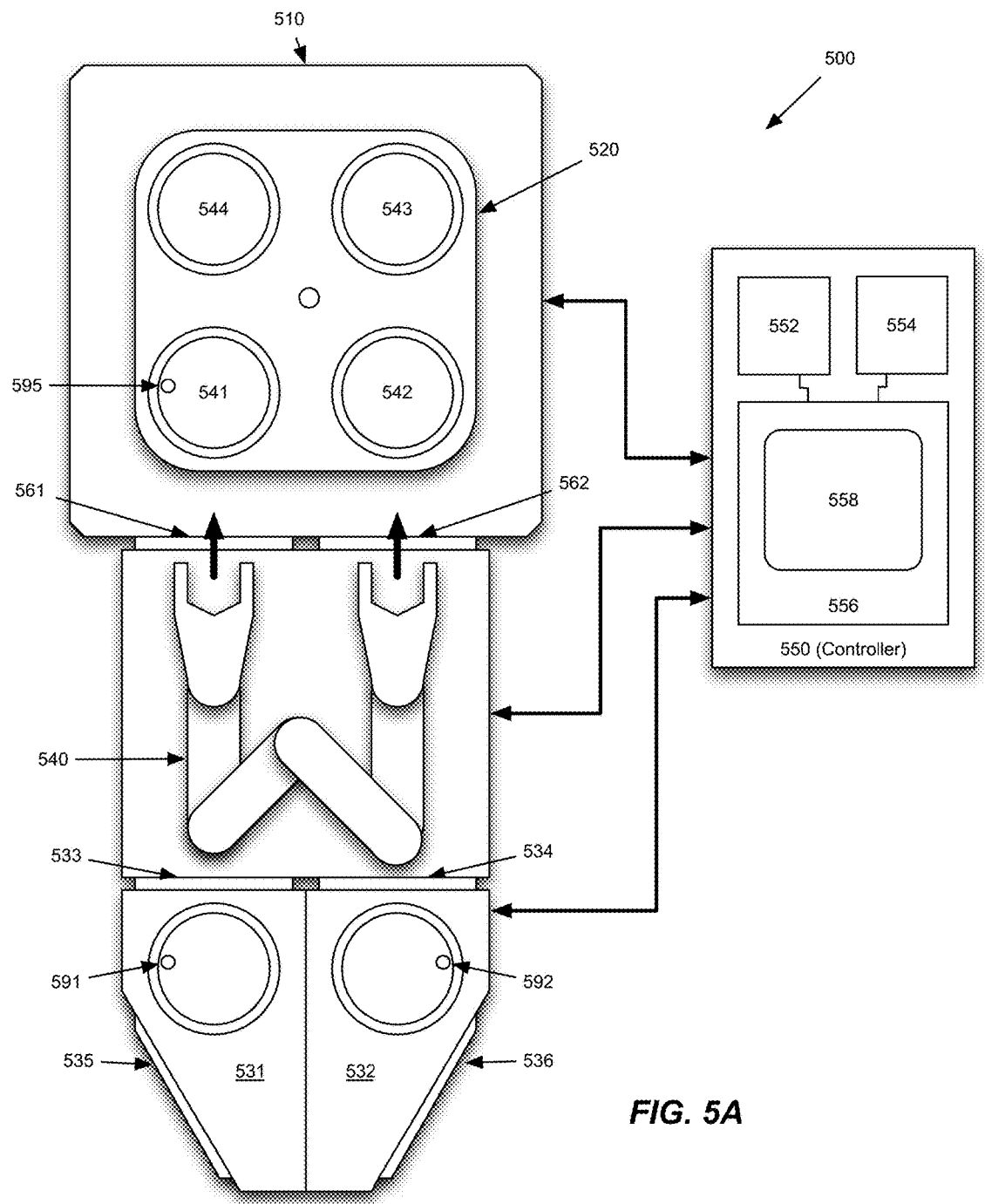
FIG. 5A schematically illustrates a multi-station plasma treatment apparatus having 4 processing stations.

FIG. 4 illustrate a plasma treatment apparatus having a single processing station. However, plasma treatment apparatuses may have multiple processing stations so that multiple substrates may be processed in parallel. Depending on the embodiment, one or more of the processing stations may have a color sensor positioned/mounted to measure color signal and to thus asses oxide removal performance in situ and in real-time during the oxide removal process. FIG. 5A schematically illustrates such a multi-station plasma treatment apparatus 500 having 4 processing stations, 541-544. In this embodiment, a single processing chamber 510 defines a high-vacuum environment for all 4 stations, however, in certain scenarios, curtains of gas may be flowed between the different processing stations to volumetrically isolate them from each other (at least to a certain extent). Furthermore, this embodiment employs a carousel 520 on which the substrates are positioned which may serve to rotate the substrates amongst the 4 processing stations. Thus, depending on the embodiment, the 4 processing stations may perform the same or different processing operations. Moreover, even if the same processing operation (or operations) are performed at each of the 4 stations, it may still be advantageous to rotate semiconductor substrates through all 4 processing stations so that any systematic differences in processing are "averaged out" over the 4 stations.

Substrates enter the processing apparatus 500 through inbound load-lock 531 and exit through outbound load-lock 532. With operation of the load-locks, entry and removal of semiconductor substrates from the apparatus may accomplished without breaking the high-pressure vacuum environment provided by processing chamber 510. Specifically, in the embodiment shown in the figure, this may this is done by closing load-lock seals 533 and 534 (which lead to the processing chamber), after placing substrates in the load-locks 531 and 532, and thereafter opening the load-lock doors 535 and 536 (which lead to the ambient environment outside the apparatus).

Within apparatus 500, substrates are transferred to and from the inbound and outbound load-locks 531 and 532 via wafer handler robot 540. Note that in this embodiment, robot 540 only transfer wafers to the processing stations nearest to it, processing stations 541 and 542. The other two processing stations 543 and 544 are accessed via rotation of carousel 520. Additional seals 561 and 562 may provide the wafer handler robot 540 access to processing chamber 510.

Color sensors may be positioned/mounted/located within plasma treatment apparatus 500 in various locations. Illustrated in FIG. 5A, a color sensor 595 is shown located at processing station 541. Rotation of substrates amongst processing stations via the carousel may make it feasible to have just a single color sensor in the processing chamber. FIG. 5A also shows apparatus 500 having color sensors 591 and 592 located in the inbound and outbound load-locks, respectively. As described above, this provides the ability to measure color signals before and after the plasma pretreatment process.

FIGS. 5B through 5D provide more detailed views of the mounting of a color sensor in a load-lock. In particular, FIG. 5B shows a load-lock 530 having a color sensor 596 and thus could correspond to outbound load-lock 532 in FIG. 5A. FIG. 5C shows a vertical cross-section as indicated by the dashed line 505 in FIG. 5B (as opposed to FIGS. 5A and 5B which show the load-lock from above). The vertical cross-section shown in FIG. 5C shows the positioning of the color sensor, and more particular shows that this particular color sensor's hardware assembly includes a fiber optic sensor head 596A, coupled one or more fiber optic lines bundled together in a single cable housing 596B which terminates in what can be referred to as color sensor body 596C (as mentioned above) which holds the actual color detection electronics. In some embodiments, sensor body 596C may additionally contain a color signal processing module having logic and/or computer-readable instructions for processing color signals (transmitted from the fiber optic sensor head) beyond basic detection (e.g., calibration, contrast enhancement, etc.). It is to be noted, therefore, that the foregoing discussion of color sensor positioning/mounting applies more precisely to the fiber optic head of the color sensor, rather than the entire color sensor. An example of such a color sensor for integration into a plasma treatment apparatus which measures the three a*, b*, and L* color components as illustrated in FIG. 2 is the Micro-Epsilon model color sensor manufactured by Micro-Epsilon of Germany.

FIG. 5C illustrates that the color sensor 596, or more precisely the color sensor's fiber optic head 596A, is pointed at the edge of wafer 507 within load-lock 530. It is noted that since the color sensor is trained on a region of the wafer other than it's center, in principle, rotation of the wafer may allow for multiple color signals to be measured at multiple azimuthally rotated points on the wafer surface. This may be more feasible when the sensor is mounted in the processing chamber instead of in the load-lock, depending on where a rotatable substrate holder may potentially be located. Multiple azimuthally distributed color signal measurements are, of course, not required, but they may provide for enhanced accuracy and precision by verifying oxide removal performance around the entire wafer perimeter.

FIG. 5D presents another vertical cross-section, this time zoomed in on the region indicated by the dashed ellipse 506 in FIG. 5C. Here, the fiber optic color sensor head 596A is shown in detail located within mount 598 which sits in the upper wall of load-lock 530. A translucent quartz window 597 allows light reflected back up from the substrate 507 (FIG. 5C) to reach color sensor 596A within it's mount 598.

In some embodiments, the color sensor may additionally include a light source for illuminating the substrate surface. This could also be by way of fiber optics; in other words the one or more fiber optic lines bundled together in cable 596B may transmit light generated from sensor body 596C to sensor head 596A where the light is emitted and directed toward the substrate. Typically, substantially white light is used and trained on a relatively small point on the substrate surface. With the sensor head positioned at 90 degrees relative to the substrate surface and in close proximity to it (as shown in FIG. 5C), the light reflected is collected by sensor head 596A, and carried back via cable 596B to the actual electronic color detector located in the color sensor's body 596C. Of course, whether the physical configuration of the color sensor includes multiple physical units comprising a main body, cable housing, and fiber optic sensor head as schematically depicted in FIG. 5C, or whether the color sensor is configured as a single physical unit, is not critical to the operation and functioning of the inventive concepts disclosed herein.

In some embodiments, the one or more color sensors of a plasma treatment apparatus are configured to send signals (electronically) to the apparatus's controller (e.g., controller 550 in FIG. 5). The controller may be configured to receive the signals and process them, implementing any of the color signal analysis methodologies described herein for estimating the extent of oxide reduction post plasma treatment (or during plasma treatment). However, in some embodiments a color signal processing module within the color sensor itself may have sufficient processing power to implement the methodologies disclosed herein to assess the extent of oxide reduction. In these sorts of embodiments, the color sensor may include logic for signaling the main apparatus controller when there is a detected problem with the plasma treatment process.

Figure 6A:
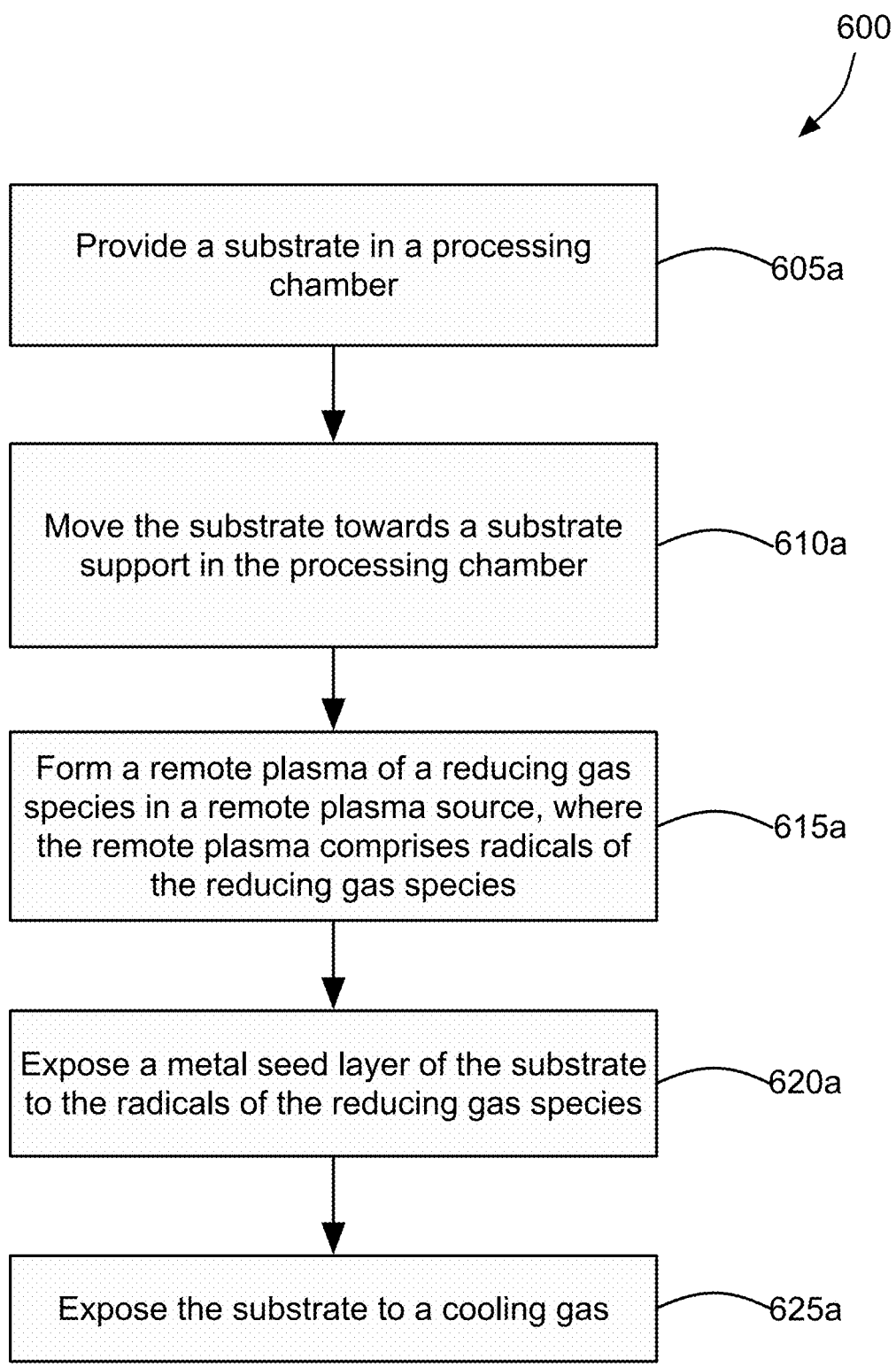
FIG. 6A shows an exemplary flow diagram illustrating a method of treating a substrate with a metal seed layer.

FIG. 6A shows an exemplary flow diagram illustrating a method of treating a substrate with a metal seed layer. FIGS. 7A-7D show examples of cross-sectional schematic diagrams illustrating various stages of treating a substrate with a metal seed layer using a plasma treatment apparatus. Some of the steps discussed in FIG. 6A may be discussed with respect to a corresponding cross-sectional schematic diagram in FIGS. 7A-7D.

In FIG. 6A, the process 600a can begin with step 605a where a substrate is provided in a processing chamber. The substrate can include a metal seed layer, where a portion of the metal seed layer has been converted to oxide of the metal. Prior to treatment of the substrate by a remote plasma, the substrate can be loaded into a processing chamber of a plasma treatment apparatus. In some embodiments, the substrate can be provided on one or more movable members in an actuated position. In some embodiments, inert gas may be flowed through the processing chamber to cool the substrate during loading. This can reduce additional oxidation of the substrate during loading. In some embodiments, upon loading the substrate into the processing chamber, the processing chamber can be closed and pumped down to vacuum or to a reduced pressure. This can provide an environment that is substantially free of oxygen. The pressure of the processing chamber can be between about 0.5 Torr and about 6 Torr, such as between about 0.5 Torr and 3 Torr. Reduced pressures can reduce the presence of oxygen in the environment. Thus, loading the substrate into the processing chamber in such conditions can reduce additional oxidation of the metal seed layer.

Figure 7A:
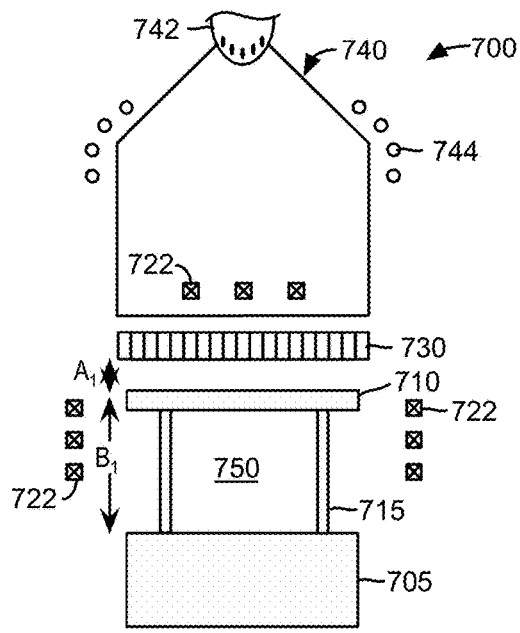
FIGS. 7A-7D show examples of cross-sectional schematic diagrams illustrating various stages of treating a substrate with a metal seed layer using a plasma treatment apparatus.

FIG. 7A shows an example of a cross-sectional schematic diagram of a plasma treatment apparatus 700 at one of the stages of treating a substrate with a metal seed layer (such as at step 605a). The plasma treatment apparatus 700 includes a substrate support 705 in a processing chamber 750, a remote plasma source 740 over the substrate support 705, and a showerhead 730 between the remote plasma source 740 and the substrate support 705. Movable members 715 may extend from the substrate support 705 towards the showerhead 730 to position the substrate 710. Examples of movable members can include lift pins and peripheral grips. The substrate 710 may include a metal seed layer, where the metal seed layer includes at least one of Cu, Co, Ru, Pd, Rh, Ir, Os, Ni, Au, Ag, Al, and W. In some embodiments, the thickness of the metal seed layer can be less than about 100 Å.

Figure 7B:
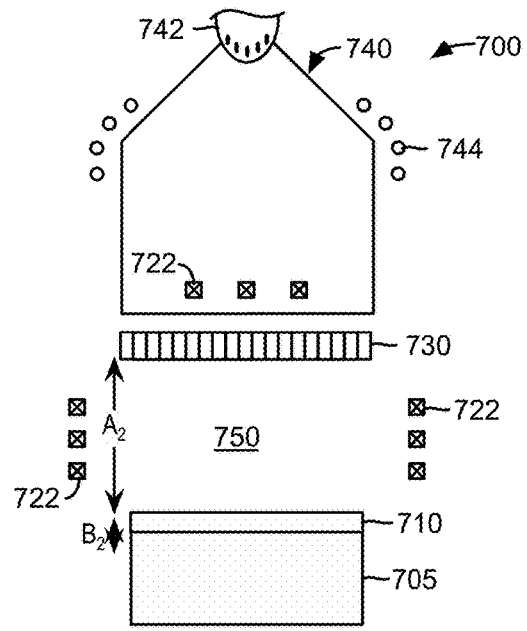

In FIG. 7A, the movable members 715 in a processing chamber 750 may position a substrate 710 in an actuated position. The actuated position can place the substrate 710 at a distance $A_1$ closer to the showerhead 730 than an unactuated position (as illustrated in FIG. 7B). In the actuated position, the distance $A_1$ between the substrate 710 and the showerhead 730 can be between about 0.05 inches and about 0.75 inches. A distance $B_1$ between the substrate 710 and the substrate support 705 can be any desired distance. For example, the distance $B_1$ can be greater than about 1 inch, such as between about 1 inch and about 5 inches. The showerhead 730 can be maintained at a relatively cool temperature, such as less than about 30° C.

Returning to FIG. 6A, at step 610a, the substrate is moved towards a substrate support in the processing chamber. In some embodiments, the substrate can be moved via the movable members to an unactuated position. The unactuated position is further from a showerhead in the processing chamber than the actuated position. In some embodiments, the substrate in the unactuated position may be in contact with the substrate support. For example, the movable members may be retracted so that the substrate can rest on the substrate support. In some embodiments, a gap can exist between the substrate support and the substrate, and heat transfer can occur via conduction, convection, radiation, or combinations thereof. The substrate support can be heated, which in turn can heat the substrate. The substrate support may be heated to a processing temperature, such as a temperature between about 0° C. and about 400° C. The temperature of the substrate support can depend on the metal seed layer of the substrate. For example, the substrate support can be heated between about 250° C. and about 300° C. for cobalt, and between about 75° C. and about 100° C. for copper. Higher temperatures of the substrate can speed up the metal oxide reduction reactions. However, the temperature may be selected to not exceed an agglomeration temperature of the metal seed layer. When the substrate is heated, the substrate may be exposed to a remote plasma treatment.

FIG. 7B shows an example of a cross-sectional schematic diagram of a plasma treatment apparatus 700 at one of the stages of treating a substrate with a metal seed layer (such as at step 610a). The plasma treatment apparatus 700 includes a substrate 710 over the substrate support 705, where the substrate 710 is in the unactuated position. In the unactuated position, the substrate 710 is positioned at a distance $A_2$ from the showerhead 730 and is further away from the showerhead 730 than in the actuated position. The distance $A_2$ between the showerhead 730 and the substrate 710 can be greater than about 1 inch, such as between about 1 inch and about 5 inches. The substrate 710 and the substrate support 705 can be in contact with each other, or a distance $B_2$ between the substrate 710 and the substrate support 705 can be relatively small so as to allow efficient heat transfer between the substrate 710 and the substrate support 705. In some embodiments, the distance $B_2$ can be between about 0 inches and about 0.5 inches. In some embodiments, the movable members 715 can be retracted so that the substrate 710 rests on the substrate support 705. The substrate support 705 can position the substrate 710 relative to the showerhead 730 by vertically moving the substrate support 705. The showerhead 730 can be maintained at a relatively cool temperature, such as less than about 30° C.

The distance $A_2$ can be adjusted and can tune the rate of reaction and the uniformity of reaction during processing of the substrate. For example, where the substrate support 705 is closer to the showerhead 730, the rate of reduction may proceed faster but achieve less uniform results. The distance $A_2$ can be adjusted by vertical movement of the substrate support 705. In some embodiments, the substrate support 705 may move from a first position to a second position in the processing chamber, where a distance between the first position and the second position is greater than about 1 inch. An increased degree of freedom for positioning the substrate support 705 provides greater flexibility in tuning the rate and uniformity of the subsequent reduction treatment.

Returning to FIG. 6A, at step 615a, a remote plasma can be formed of a reducing gas species in a remote plasma source, where the remote plasma includes radicals of the reducing gas species. The remote plasma can be formed by exposing the reducing gas species to a source of energy. The energy source can produce radicals, ions, and other charged species that can be flowed towards the substrate. In some embodiments, the energy source can be an RF discharge. When the remote plasma is formed, the substrate can be or is already heated to a desired processing temperature. In some embodiments, a showerhead is connected to the remote plasma source and filters out the ions so that the radicals of the reducing gas species can be flowed towards the substrate in the processing chamber.

At step 620a, the metal seed layer of the substrate is exposed to the radicals of the reducing gas species. A portion of the metal seed layer can include an oxide of the metal seed layer. Ions, radicals, and other charged species formed in the remote plasma flow through the showerhead, and ions and other charged species can be filtered out so that the substrate is substantially exposed to radicals of the reducing gas species. The metal oxide can react with the radicals of the reducing gas species or the reducing gas species itself to convert the metal oxide to metal. The reaction takes place under conditions that convert the metal oxide to metal. The metal oxide in the metal seed layer is reduced to form a film integrated with the metal seed layer. Reduction of a metal oxide in a metal seed layer using a reducing gas species can be described in U.S. application Ser. No. 13/787,499, filed Mar. 6, 2013, which is incorporated herein by reference in its entirety and for all purposes. In some embodiments, radicals of the reducing gas species flow through the showerhead when the showerhead is maintained at a temperature below about 30° C.

Figure 7C:
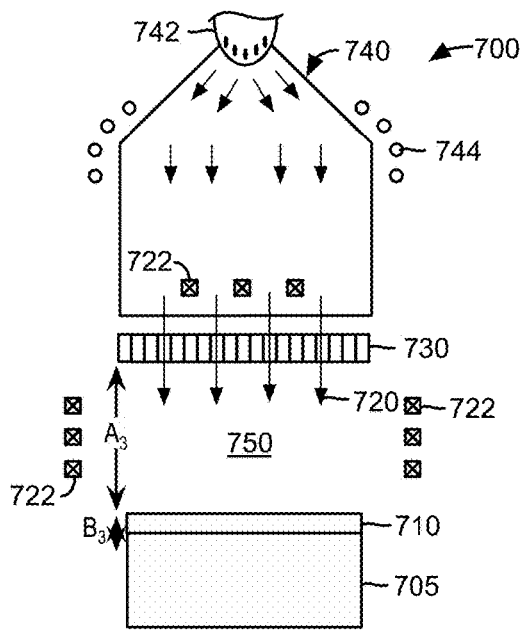

FIG. 7C shows an example of a cross-sectional schematic diagram of a plasma treatment apparatus 700 at one of the stages of treating a substrate with a metal seed layer (such as at steps 615a and 620a). The plasma treatment apparatus 700 includes a remote plasma source 740 over the substrate 710 and one or more coils 744 surrounding the walls of the remote plasma source 740. A gas inlet 742 can be connected to the remote plasma source 740 to deliver a reducing gas species 720 into an internal volume of the remote plasma source 740. The reducing gas species 720 can be flowed at a flow rate between about 500 sccm and about 30,000 sccm, which can be applicable to any substrate size. In some embodiments, the reducing gas species 720 can include at least one of $H_2$, $NH_3$, CO, $B_2H_6$, sulfite compounds, carbon and/or hydrocarbons, phosphites, and $N_2H_4$. Power supplied to the one or more coils 744 can generate a remote plasma of the reducing gas species 720 in the remote plasma source 740. RF plasma power supplied to the coils 744 can be between about 0.5 kW and about 6 kW. The remote plasma can include radicals of the reducing gas species 720, such as H*, NH*, $NH_2$*, or $N_2H_3$*. The remote plasma can also include ions and other charged species, but the showerhead 730 can filter them out so that the radicals of the reducing gas species 720 arrive at the substrate 710. The radicals of the reducing gas species 720 flow from the remote plasma source 740 through the showerhead 730 and onto the surface of the substrate 710 in the processing chamber 750. The showerhead 730 can be maintained at a relatively cool temperature, such as less than about 30° C. The cooled showerhead 730 can limit excess heat from reaching the substrate 710 and avoid damaging the metal seed layer in the substrate 710.

In FIG. 7C, the substrate 710 can remain in an unactuated position. A distance $A_3$ between the substrate 710 and the showerhead 730 can be adjusted by moving the substrate support 705. Adjusting the distance $A_3$ can tune the rate of reduction reaction and the uniformity of the reduction reaction occurring at the substrate 710. For example, a shorter distance $A_3$ can lead to faster conversion of metal oxide but less uniformity, while a longer distance $A_3$ can lead to slower conversion of metal oxide but greater uniformity. In some embodiments, the distance $A_3$ can be the same as the distance $A_2$. Movable members 715 can be retracted so that the substrate 710 and the substrate support 705 remain in contact, or a distance $B_3$ between the substrate 710 and the substrate support 705 can be the same as the distance $B_2$ in FIG. 7B.

The temperature of the substrate support 705 can be adjusted via an active heating or active cooling system. The temperature can be tuned according to the metal seed layer in the substrate 710 being treated. For example, the temperature of the substrate support 705 can be changed when switching between two different metal seed layers that require operating in two different temperature regimes. For example, the substrate support 705 can be heated between about 250° C. and about 300° C. for a cobalt seed layer, and switched to be between about 75° C. and about 100° C. for a copper seed layer.

Returning to FIG. 6A, at step 625a, the substrate is exposed to a cooling gas. The cooling gas can include at least one of argon, helium, and nitrogen. In some embodiments, the cooling gas can be produced by expanding a cold liquid to a gas. Exposing the substrate to the cooling gas can cool the substrate to a temperature below about 30° C. Thus, the cooling gas can be delivered at a temperature below ambient conditions to cool the substrate. In some embodiments, the substrate can be moved to an actuated position via the movable members prior to exposing the substrate to the cooling gas. The substrate can be exposed to the cooling gas while in the actuated position for faster cooling. In some embodiments, the substrate can be transferred to an electroplating apparatus after exposing the substrate to the cooling gas. Alternatively, the substrate may be transferred to an electroless plating or other metal deposition apparatus. In some embodiments, the processing chamber can be vented to atmospheric conditions with a venting gas after exposing the substrate to the cooling gas.

Figure 7D:
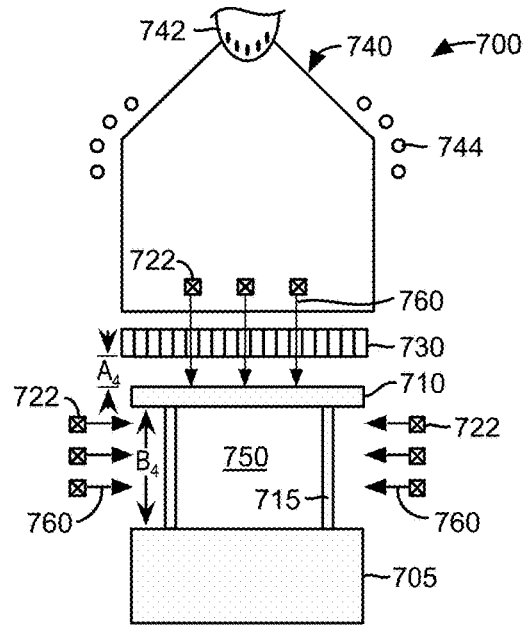

FIG. 7D shows an example of a cross-sectional schematic diagram of a plasma treatment apparatus 700 at one of the stages of treating a substrate with a metal seed layer (such as at step 625a). The plasma treatment apparatus 700 can include one or more cooling gas inlets 722 for delivering a cooling gas 760. The cooling gas inlets 722 may be positioned around the substrate 710, including above and to the side of the substrate 710. Cooling gas 760 can be directed onto the substrate 710 through the showerhead 730 and perpendicular to the substrate plane. Cooling gas 760 can also be directed onto the substrate 710 and parallel to the substrate plane from cooling gas inlets 722 on the sides of the process chamber 750. The cooling gas 760 can be flowed into the process chamber 750 at a flow rate between about 0.1 slm and about 100 slm. The cooling gas inlets 722 can flush cooling gas 760 across the substrate 710 to rapidly cool the substrate 710 prior to transferring the substrate to an electroplating, electroless plating, or other metal deposition apparatus. In some embodiments, the substrate 710 can be cooled without turning off or cooling the substrate support 705. This can enable the substrate 710 to be treated and cooled within a single process chamber 750 without having to use a two-chamber design having separate heating and cooling zones.

In FIG. 7D, the substrate 710 can be in an actuated position. A distance $A_4$ between the showerhead 730 and the substrate 710 can be between about 0.05 inches and about 0.75 inches. In some embodiments, the distance $A_4$ can be the same as the distance $A_1$ in FIG. 7A. By positioning the substrate 710 closer to a cooled showerhead 730 and away from a hot substrate support 705, the substrate 710 can be cooled at a faster rate. Movable members 715 can lift the substrate 710 away from the substrate support 705 and towards the showerhead 730. A distance $B_4$ between the substrate support 705 and the substrate 710 can be greater than about 1 inch, or between about 1 inch and about 5 inches. In some embodiments, the distance $B_4$ can be the same as the distance $B_1$ in FIG. 7A. In some embodiments, when the substrate 710 is in the actuated position and cooled to about room temperature, the process chamber 750 can be vented to atmospheric conditions and transferred to an electroplating, electroless plating, or other metal deposition apparatus.

Figure 6B:
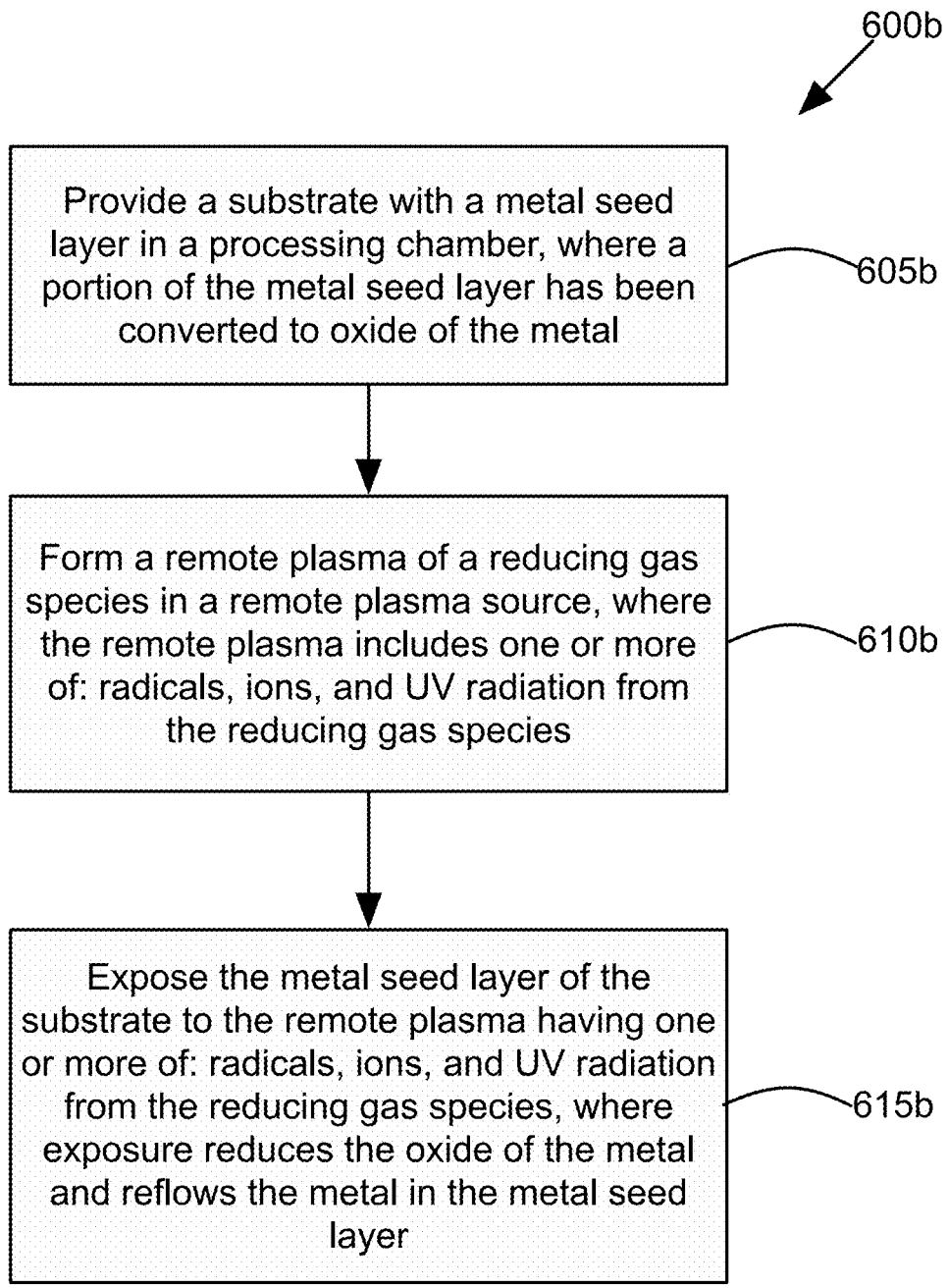
FIG. 6B shows an exemplary flow diagram illustrating another method of treating a substrate with a metal seed layer.

FIG. 6B shows an exemplary flow diagram illustrating another method of treating a substrate with a metal seed layer. At step 605b of the method 600b, a substrate with a metal seed layer can be provided in a processing chamber, as generally described at step 605a of the method 600a. The metal seed layer can have a portion that has been converted to oxide of the metal.

At step 610b, a remote plasma of a reducing gas species can be formed in a remote plasma source, where the remote plasma includes one or more of: radicals, ions, and UV radiation from the reducing gas species. The energy of the remote plasma may be increased to generate higher energy species, including higher energy ions. Higher energy ions may be produced in high density plasma (HDP) processing systems and/or sputtering systems. The remote plasma may also generate UV radiation as a result of excitation of the reducing gas species. The generated UV radiation can have a wavelength between about 100 nm and about 400 nm. For example, the generated UV radiation can include short wavelength UV light, such as between about 120 nm and about 200 nm, and long wavelength UV light, such as between about 200 nm and about 400 nm. In addition, the remote plasma may include neutrals and/or generate recombined molecules of the reducing gas species.

At step 615b, the metal seed layer of the substrate is exposed to the plasma, where the exposure reduces the oxide of the metal and reflows the metal in the metal seed layer. In some implementations, reflow of the metal and the reduction of the metal oxide may occur concurrently. In some implementations, the remote plasma can include radicals, ions, and UV radiation from the reducing gas species, or some combination thereof. A showerhead between the remote plasma source and the processing chamber can have a thickness, a number of holes, and an average diameter of holes configured to permit radicals, ions, and UV radiation flow or otherwise travel through the showerhead toward the substrate. The radicals, ions, and UV radiation may enter the processing chamber and reduce metal oxide in the metal seed layer. High energy ions may penetrate further from the surface of the substrate to provide a reducing chemistry throughout more of the metal seed layer. UV radiation may activate the metal oxide surface to improve the thermodynamics of the reduction process, or directly reduce the metal oxide itself. The UV radiation may also be absorbed by the reducing gas species and give rise to radicals that can reduce metal oxide. Furthermore, neutral molecules of the reducing gas species may further react and reduce metal oxide in the metal seed layer.

In some implementations, the metal in the metal seed layer may be excited and mobilized upon exposure. The metal may be reflowed to reduce gaps and voids in the metal seed layer, which can reduce the surface roughness of the metal seed layer. How much the metal is reflowed can depend on the temperature of the substrate, the chamber pressure, the reducing gas species, and the intensity of the UV radiation, for example. As the metal is reflowed and redistributed on the underlying layer, a more uniform and continuous metal seed layer can be formed.

EXAMPLES

The following examples illustrate the viability of using a color sensor to monitor oxide layer thickness and to gauge the effectiveness of a plasma pretreatment for reducing oxides on metal seed layers. In particular, the sensitivity of the b* color component to oxide layer thickness will be demonstrated.

Figure 8:
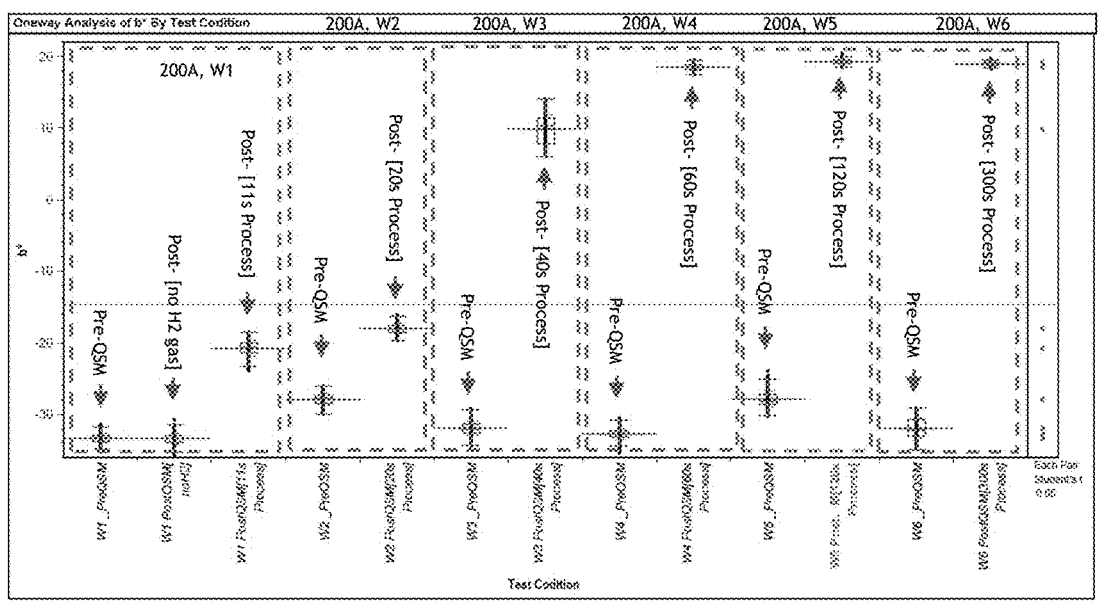
FIG. 8 shows the results of b* color component measurements done on 6 wafers having 200 Å oxide layers before and after plasma pretreatment.

FIG. 8 shows the results of experiments done on 6 wafers having a 200 Å oxide layer. For each wafer, labeled "W1" through "W6," the value of the b* color component was measured before and after treatment with $H_2$ plasma: the b* measurement on the left labeled "Pre-QSM" was taken prior to $H_2$ plasma treatment and the b* measurement on the right labeled "Post" was taken after an $H_2$ plasma treatment of the indicated duration (11 seconds, 20 seconds, and so forth). It is seen for all 6 wafers that plasma treatment causes a significant increase in the value of the b* color component, maxing out for plasma treatment durations of 60 seconds or longer. Note that for the first wafer, labeled "W1", an additional b* value was also measured after a "treatment" with no reducing $H_2$ gas in the processing chamber. This is seen to give the same b* value as if no pretreatment had been done, providing further confirmation that oxide reduction accounts for the changed values of the b* color component. The results are summarized in the following table:

TABLE II

| Process Condition | b* Change |
| --- | --- |
| No $H_2$, 2 kW, 60 s Process | 0.24% |
| With $H_2$, 2 kW, 11 s Process | −39.8% |
| With $H_2$, 2 kW, 20 s Process | −35.5% |
| With $H_2$, 2 kW, 40 s Process | −136.2% |
| With $H_2$, 2 kW, 60 s Process | −158.3% |
| With $H_2$, 2 kW, 120 s Process | −171.3% |
| With $H_2$, 2 kW, 300 s Process | −163.9% |

Figure 9A:
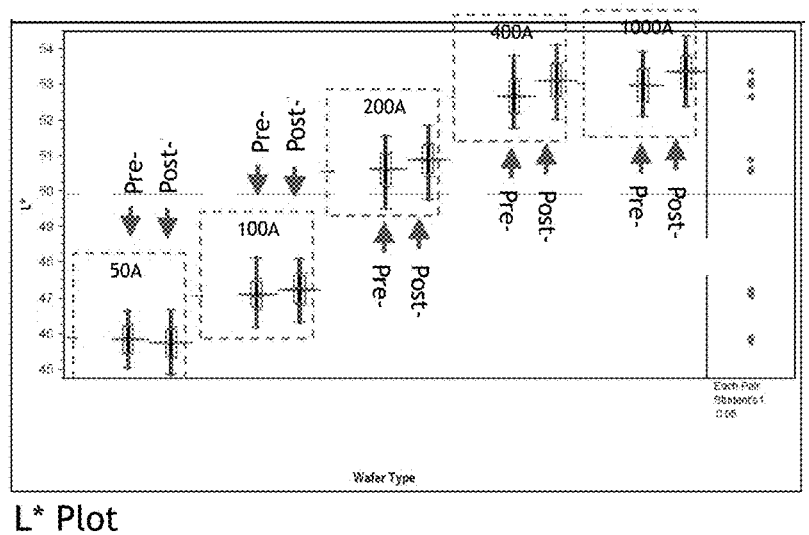
FIG. 9A shows the affect of $H_2$ plasma treatment on the L* color component.
Figure 9B:
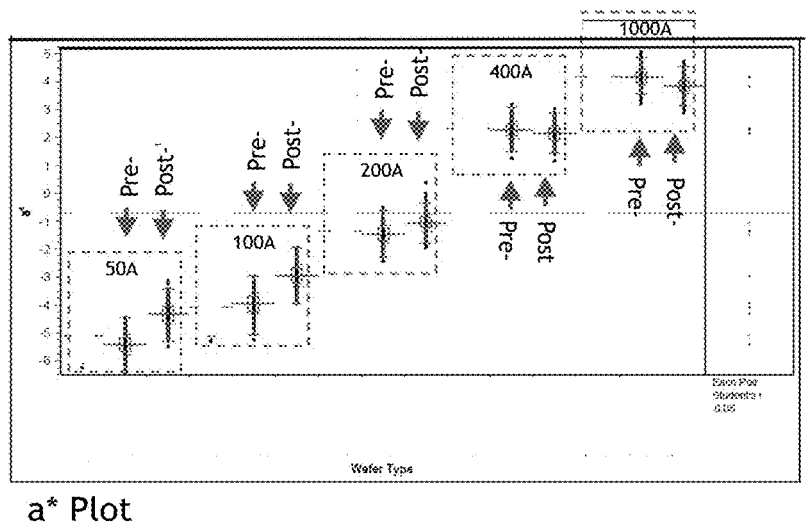
FIG. 9B shows the affect of $H_2$ plasma treatment on the a* color component.
Figure 9C:
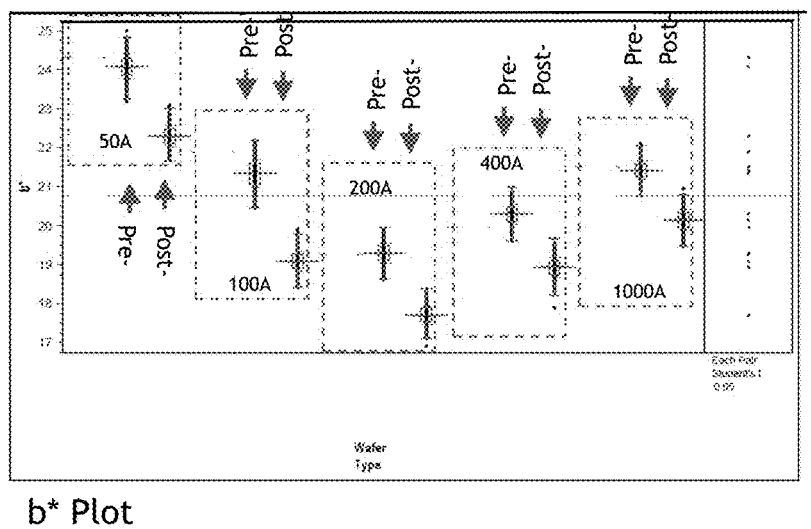
FIG. 9C shows the affect of $H_2$ plasma treatment on the b* color component.

FIGS. 9A through 9C compare the affect of $H_2$ plasma treatment on the values of each of the three color components: L*, a*, and b* (FIGS. 9A-9C, respectively). In these experiments, 5 wafers having different oxide layer thicknesses—50 Å, 100 Å, 200 Å, 400 Å, and 1000 Å—underwent pretreatment. Comparing the 3 figures, it is seen that, for all oxide layer thicknesses, only the b* color component shows statistically significant variations pre- and post-plasma treatment. It is noted that the difference seems to be somewhat more pronounced for the thinner oxide layers of 50 Å, 100 Å.

Whereas FIGS. 8 and 9A-9C demonstrated the sensitivity of the b* color component in a bench-top setting, FIGS. 10A, 10B, 11A, and 11B demonstrate the effectiveness of monitoring the b* color component in real-time in the load-lock of a plasma treatment apparatus, such that schematically illustrated in FIGS. 5A-5D. These FIGS. 10A-11B) show the value of the b* color component as a function of time over the course of a "multilayer recipe" where the wafer passes through the outbound load-lock twice.

Figure 10A:
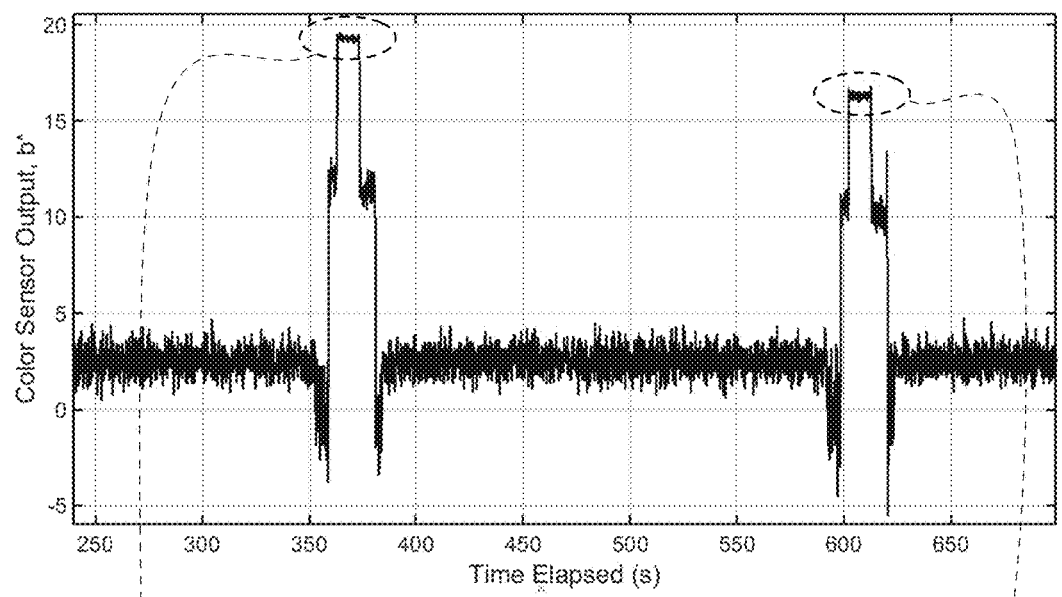
FIG. 10A shows the value of the b* color component as a function of time over the course of a "multilayer recipe" where the wafer passes through an outbound load-lock twice.

First referring to FIG. 10A, it is seen that the wafer's first pass under the color sensor of the outbound load-lock occurs at about 370 seconds in the plot and corresponds to the wafer leaving the plasma processing chamber without the plasma having been turned on—in other words, it represents a measurement of the b* color component before plasma treatment. This first peak has two shoulders on it bracketing the center of the peak where it has its maximum value. The reason for this is that the pedestal in the load-lock is raised and lowered while holding the wafer, and thus the higher values in the center of the peak correspond to the pedestal in the "up" position and the substrate being closer to the color sensor. This underscores the importance of keeping the color sensor at an optimal distance from the surface of the wafer to maximize the signal-to-noise ratio of the b* component.

Figure 10B:
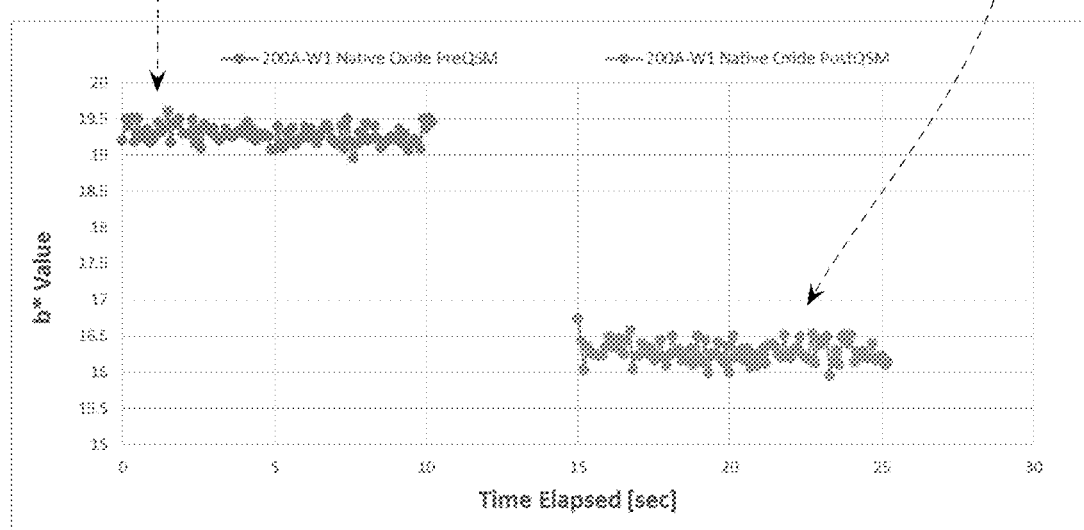
FIG. 10B shows a close-up re-plotted view of a portion of the data from FIG. 10A.

The wafer's second pass under the color sensor of the outbound load-lock occurs at about 610 seconds in FIG. 10A and corresponds to the wafer leaving the plasma processing chamber after the plasma was turned on for oxide reduction. The plasma process had a duration of 60 seconds at a temperature of 250 C (prior to plasma treatment, the wafer had a 100 Å oxide layer). The shoulders are present in the peak at 610 seconds as seen in the previous peak at 370 seconds, but the overall magnitude of the b* values are significantly reduced confirming that the b* color component may serve as an indicator of plasma treatment. FIG. 10B zooms in on these two regions (as indicated by the dashed lines in the figures) and again emphases the differences in b* color component values that one sees pre and post plasma treatment.

Once again, the shoulders on the peaks shown in FIG. 10A illustrate the importance of choosing the right gap between the surface of the substrate and the head of the color sensor in order to have a strong enough b* signal and an adequate signal-to-noise ratio. Based on experiments like the one just described it has been found that a gap of between about 0.1" and 5" is adequate, and more preferred, between about 0.4" and 1".

Figure 11A:
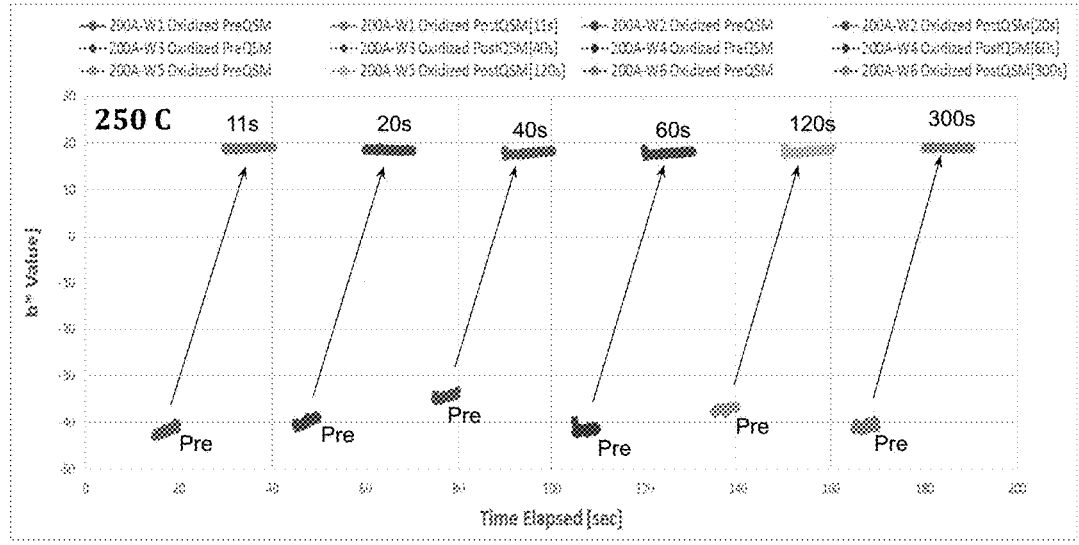
FIG. 11A plots values of the b* color component measured from 6 wafers (each having a 200 Å oxide layer) which have been plasma treated for 6 different time durations at 250 C.
Figure 11B:
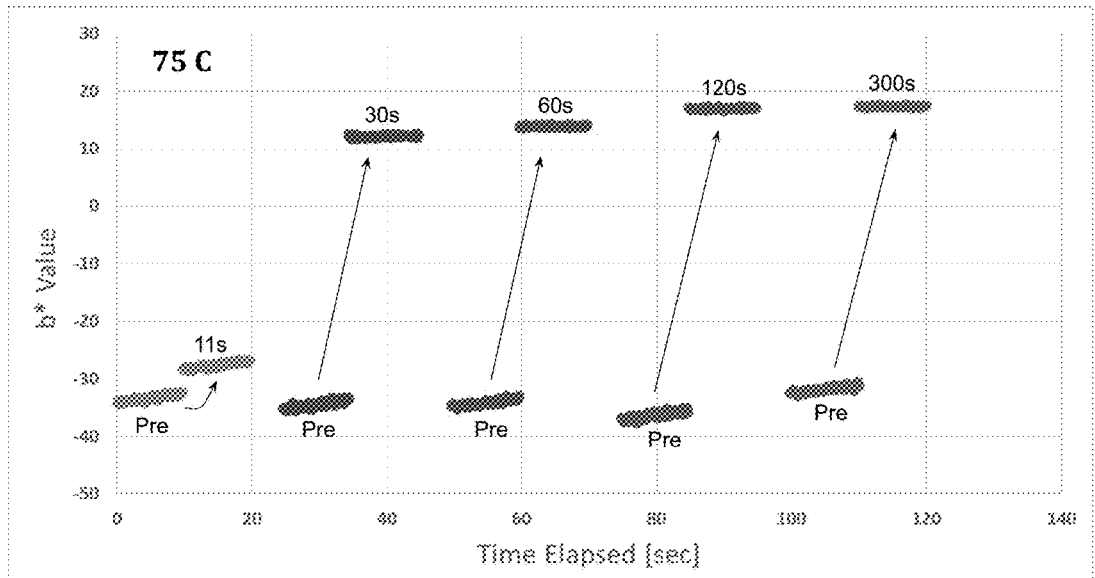
FIG. 11B plots values of the b* color component measured from 5 wafers (each having a 200 Å oxide layer) which have been plasma treated for 5 different time durations at 75 C.

Finally, data similar to that of FIG. 10B is shown in FIGS. 11A and 11B, except, that in the latter figures, the plots show results for 6 wafers (each having a 200 Å oxide layer) which have been plasma treated for different time durations. FIG. 11A shows results for 6 plasma treatments (of different time durations) at 250 C, and FIG. 11B shows results for 5 plasma treatments at 75 C. For nearly all cases, a significant change in b* color component is exhibited versus that measured from each wafer before plasma treatment (labeled "pre" in the figures). The higher temperature results in FIG. 11A (250 C) appear to (for the most part) "max out" (oxide removal saturates) at even just 11 seconds of plasma treatment, whereas at the lower temperature shown in FIG. 11B (75 C), there is only a slight change in the b* color component at 11 seconds, a significant change appearing first in the 30 second result, and then becoming more pronounced for longer time durations up to the 300 second result shown in the figure. In summary, the results shown in FIGS. 11A and 11B illustrate that even at the lower temperature of 75 C, only 30 seconds of plasma treatment generates a significant change in the measured b* color component upon which an assessment of plasma treatment effectiveness can thus be made.

System Controllers

The plasma treatment methodologies and techniques for assessing oxide reduction effectiveness may be implemented in program instructions which may reside on the system controller of a plasma treatment apparatus and/or may reside on a remote non-transitory medium which is accessible from and readable by the controller of the plasma treatment apparatus. An example of such a system controller is schematically illustrated in FIG. 5A. As shown in FIG. 5A, system controller 550 includes one or more memory devices 556, one or more mass storage devices 554, and one or more processors 552. Processor 552 may include one or more CPUs, ASICs, general-purpose computer(s) and/or specific purpose computer(s), one or more analog and/or digital input/output connection(s), one or more stepper motor controller board(s), etc.

In some embodiments, a system controller (e.g., 550 in FIG. 5A) controls some or all of the operations of a process tool (e.g., plasma treatment apparatus 500 in FIG. 5A) including the operations of its individual process stations. Machine-readable system control instructions 558 may be provided for implementing/performing the plasma treatment methodologies and color sensor operation and color signal analysis as described herein. The instructions may be provided on machine-readable, non-transitory media which may be coupled to and/or read by the system controller. The instructions may be executed on processor 552—the system control instructions, in some embodiments, loaded into memory device 556 from mass storage device 554. System control instructions may include instructions for controlling the timing, mixture of gaseous and liquid reactants, chamber and/or station pressures, chamber and/or station temperatures, wafer temperatures, target power levels, RF power levels (e.g., DC power levels, RF bias power levels), RF exposure times, substrate pedestal, chuck, and/or susceptor positions, and other parameters of a particular process performed by a process tool.

Semiconductor substrate processing operations may employ various types of processes including, but not limited to, processes related to the etching of film on substrates, deposition processes (such as atomic layer deposition (ALD), by plasma-activation of surface adsorbed film precursors), as well as other types of substrate processing operations, such as plasma-based oxide removal from a metal seed layer in preparation for electroplating, as well as control of electroplating operations.

System control instructions 558 may be configured in any suitable way. For example, various process tool component subroutines or control objects may be written to control operation of the process tool components necessary to carry out various process tool processes. System control instructions may be coded in any suitable computer readable programming language. In some embodiments, system control instructions are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 558 may include input/output control (IOC) sequencing instructions for controlling the various parameters described above. For example, each phase of a deposition and/or etch process or processes may include one or more instructions for execution by the system controller. The instructions for setting process conditions for a film deposition and/or etch process phase, for example, may be included in a corresponding deposition and/or etch recipe phase. In some embodiments, the recipe phases may be sequentially arranged, so that all instructions for a process phase are executed concurrently with that process phase.

Other computer-readable instructions and/or programs stored on mass storage device 554 and/or memory device 556 associated with system controller 550 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal and to control the spacing between the substrate and other parts of process tool. The positioning program may include instructions for appropriately moving substrates in and out of the reaction chamber as necessary to deposit and/or etch film on the substrates.

A process gas control program may include instructions for controlling gas composition and flow rates and optionally for flowing gas into the volumes surrounding one or more process stations prior to deposition and/or etch in order to stabilize the pressure in these volumes. In some embodiments, the process gas control program may include instructions for introducing certain gases into the volume(s) surrounding the one or more process stations within a processing chamber during film deposition and/or etching operations on substrates. The process gas control program may also include instructions to deliver these gases at the same rates, for the same durations, or at different rates and/or for different durations depending on the composition of the film being deposited and/or the nature of the etching process involved. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates and/or etching of the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates and/or etching of the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on and/or etching of the substrates.

In some embodiments, there may be a user interface associated with the system controller. The user interface may include a display screen, graphical software displays of the apparatus and/or process conditions, and user input devices such as pointing devices, keyboards, touch screens, microphones, etc.

In some embodiments, parameters adjusted by system controller may relate to process conditions. Non-limiting examples include process gas compositions and flow rates, temperatures (e.g., substrate holder and showerhead temperatures), pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of the system controller from various process tool sensors. The signals for controlling the processes may be output on the analog and/or digital output connections of the process tool. Non-limiting examples of process tool sensors that may be monitored include mass flow controllers (MFCs), pressure sensors (such as manometers), temperature sensors such as thermocouples, etc. Appropriately programmed feedback and control algorithms may be used with data from these sensors to maintain process conditions.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module (employing inductively or capacitively coupled plasmas), a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Photolithographic Patterning

The apparatuses/processes described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, and apparatuses have been described in detail within the context of specific embodiments for the purpose of promoting clarity and understanding, it will be apparent to one of ordinary skill in the art that there are many alternative ways of implementing these processes, methods, systems, and apparatuses which are within the scope and spirit of this disclosure. Accordingly, the embodiments described herein are to be viewed as illustrative of the disclosed inventive concepts rather than limiting or restrictive, and are not to be used as an impermissible basis for unduly limiting the scope of the appended Claims.

We claim:

1. A plasma treatment apparatus for reducing metal oxides present on the surface of a metal seed layer of a semiconductor substrate in preparation for a subsequent electroplating operation, the apparatus comprising:
   a processing chamber having at least one processing station therein;
   a substrate holder configured to hold a substrate at the processing station;
   a plasma generator configured to generate a plasma within and/or provide it to the processing chamber;
   a color sensor configured to measure a color signal from a substrate, the color signal having one or more color components; and
   a controller having non-transitory computer-readable instructions for:
      operating the plasma generator to generate a plasma within and/or provide it to the processing chamber so that the plasma contacts the surface of a substrate at the processing station to treat it by reducing metal oxides thereon;
      operating the color sensor, after the plasma contacts the substrate surface, to measure a post-plasma-contact color signal from the surface, the color signal having one or more color components; and
      estimating the extent of the oxide reduction due to the plasma treatment based on the post-plasma contact color signal.

2. The apparatus of claim 1, wherein the color sensor is located and/or configured so as to measure the color signal from the substrate while the substrate is located at the processing station.

3. The apparatus of claim 1, further comprising:
   a load-lock configured to provide substrate access to the processing chamber; and
   wherein the color sensor is located and/or configured so as to measure the color signal from the substrate while the substrate is located within the load-lock.

4. The apparatus of claim 1, wherein the color sensor is configured to measure a color signal having a b* color component.

5. The apparatus of claim 4, wherein estimating the extent of the oxide reduction due to the plasma treatment is done based on the b* component of the post-plasma contact color signal.

6. The apparatus of claim 1, wherein estimating the extent of the oxide reduction due to the plasma treatment comprises:

comparing the post-plasma-contact color signal to one or more reference color signals.

7. The apparatus of claim 1, wherein estimating the extent of the oxide reduction due to the plasma treatment comprises:
   calculating one or more metrics, each of which is indicative of the difference between the post-plasma-contact color signal and a reference color signal from a set of one or more reference color signals.

8. The apparatus of claim 7, wherein:
   the color sensor is configured to measure a color signal having a b* color component, and
   each metric is monotonically related to the absolute value of the difference between the b* component of the post-plasma-contact color signal and the b* component of a reference color signal.

9. The apparatus of claim 8, wherein the comparing is done based on the b* component of the color signals.

10. The apparatus of claim 8, wherein estimating the extent of the oxide reduction due to the plasma treatment comprises:
    calculating a metric which is indicative of the difference between the pre- and post-plasma-contact color signals.

11. The apparatus of claim 10, wherein the metric is monotonically related to the absolute value of the difference between the b* component of the pre- and post-plasma-contact color signals.

12. The apparatus of claim 10, wherein the plasma generator is remote from the processing chamber.

13. The apparatus of claim 1, wherein the controller has further non-transitory computer-readable instructions for:
    operating the color sensor, before contacting with the plasma, to measure a pre-plasma-contact color signal from said surface, the color signal having one or more color components,
    wherein estimating the extent of the oxide reduction due to the plasma treatment comprises:
    comparing the pre- and post-plasma-contact color signals.

14. The apparatus of claim 1, wherein the plasma generator is configured to generate hydrogen radicals with the plasma.

15. The apparatus of claim 1, wherein the metal is copper.

16. The apparatus of claim 1, wherein the metal is cobalt.

17. The apparatus of claim 1, wherein the color sensor is configured to be located about 0.1-5" from the substrate surface during the measuring of the post-plasma-contact color signal from the surface.

18. The apparatus of claim 17, wherein the color sensor is configured to be located about 0.4-1" from the substrate surface during the measuring of the post-plasma-contact color signal from the surface.

* * * * *